(12) United States Patent
Goto et al.

(10) Patent No.: US 12,531,539 B2
(45) Date of Patent: Jan. 20, 2026

(54) RESONANCE DEVICE, COLLECTIVE BOARD, AND METHOD OF MANUFACTURING RESONANCE DEVICE

(71) Applicant: Murata Manufacturing Co., Ltd., Nagaokakyo (JP)

(72) Inventors: Yuichi Goto, Nagaokakyo (JP); Ville Kaajakari, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1004 days.

(21) Appl. No.: 17/678,795

(22) Filed: Feb. 23, 2022

(65) Prior Publication Data

US 2022/0182036 A1    Jun. 9, 2022

Related U.S. Application Data

(63) Continuation of application No. PCT/JP2020/017088, filed on Apr. 20, 2020.

(60) Provisional application No. 62/897,559, filed on Sep. 9, 2019.

(51) Int. Cl.
| | |
|---|---|
| *H03H 9/17* | (2006.01) |
| *H03H 3/02* | (2006.01) |
| *H03H 9/10* | (2006.01) |
| *H03H 9/13* | (2006.01) |

(52) U.S. Cl.
CPC ........... *H03H 9/17* (2013.01); *H03H 3/02* (2013.01); *H03H 9/10* (2013.01); *H03H 9/13* (2013.01)

(58) Field of Classification Search
CPC .. H03H 9/10; H03H 9/13; H03H 9/17; H03H 9/125; H03H 9/2489; H03H 9/1057; H03H 9/0595; H03H 3/02; H03H 3/0072
See application file for complete search history.

(56) References Cited

U.S. PATENT DOCUMENTS

| | | | |
|---|---|---|---|
| 10,972,071 B2* | 4/2021 | Nishimura | ............... H03H 9/17 |
| 2008/0290759 A1 | 11/2008 | Kaida et al. | |
| 2019/0089321 A1 | 3/2019 | Morinaga | |
| 2020/0204155 A1 | 6/2020 | Inoue et al. | |
| 2021/0167751 A1* | 6/2021 | Goto | .................... H03H 9/2489 |

(Continued)

FOREIGN PATENT DOCUMENTS

| | | |
|---|---|---|
| JP | 2003264444 A | 9/2003 |
| JP | 2011166352 A | 8/2011 |

(Continued)

OTHER PUBLICATIONS

International Search Report in PCT/JP2020/017088, mailed Jun. 23, 2020, 3 pages.

*Primary Examiner* — J. San Martin

(74) *Attorney, Agent, or Firm* — ArentFox Schiff LLP

(57) ABSTRACT

A resonance device is provided that includes a first substrate with a resonator having an upper electrode, a second substrate that is disposed such that a first surface faces the first substrate with the resonator therebetween, a first terminal that is disposed on a second surface of the second substrate and that is electrically connected to the upper electrode, a second terminal that is disposed on the second surface and that applies a reference electric potential to the resonator, and an extended wiring line that is connected to the first terminal electrically and that extends on the second surface to an outer edge.

20 Claims, 14 Drawing Sheets

(56) References Cited

U.S. PATENT DOCUMENTS

2023/0361740 A1* 11/2023 Higuchi ............... H03H 9/2447
2023/0361741 A1* 11/2023 Fukumitsu ........... H03H 9/0595

FOREIGN PATENT DOCUMENTS

| JP | 2015041891 A | 3/2015 |
|---|---|---|
| JP | 2016116054 A | 6/2016 |
| JP | 2018019200 A | 2/2018 |
| WO | 2007091376 A1 | 8/2007 |
| WO | 2017212677 A1 | 12/2017 |
| WO | 2019054349 A1 | 3/2019 |
| WO | 2019064663 A1 | 4/2019 |

\* cited by examiner

FIG.7
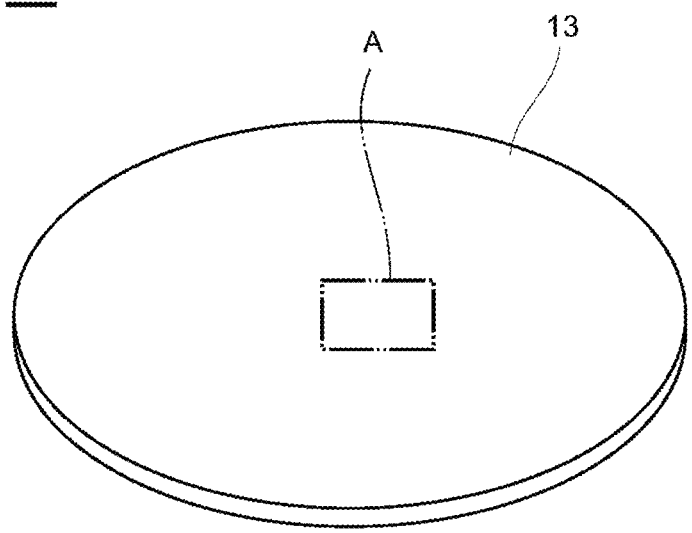
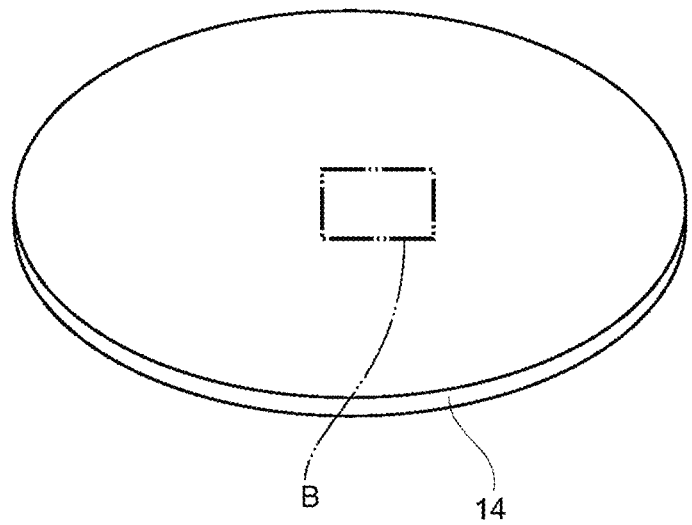

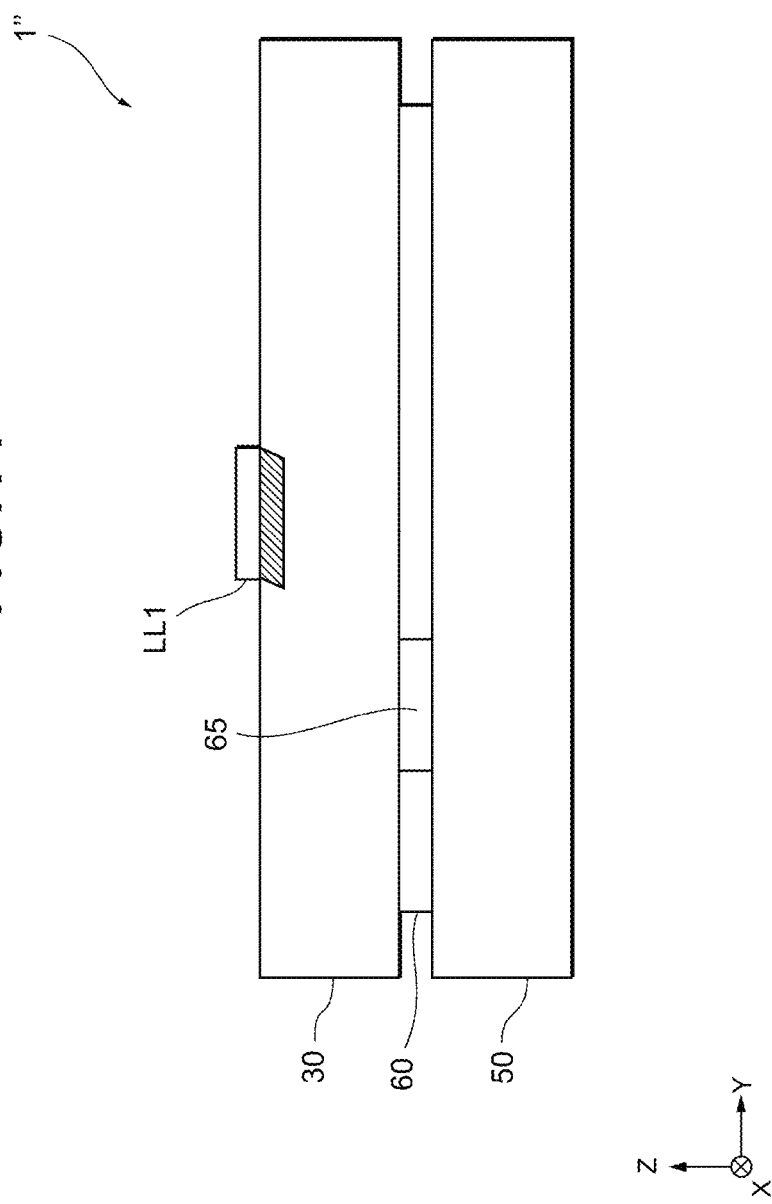

RESONANCE DEVICE, COLLECTIVE BOARD, AND METHOD OF MANUFACTURING RESONANCE DEVICE

CROSS REFERENCE TO RELATED APPLICATIONS

The present application is a continuation of PCT/JP2020/017088 filed Apr. 20, 2020, which claims priority to U.S. Provisional Patent Application No. 62/897,559, filed Sep. 9, 2019, the entire contents of each of which are incorporated herein by reference.

TECHNICAL FIELD

The present invention relates to a resonance device, a collective board, and a method of manufacturing a resonance device.

BACKGROUND

Devices that are manufactured by using, for example, a MEMS (Micro Electro Mechanical Systems) technique are currently used. As for an example of the devices, multiple devices are formed on a collective board (e.g., a wafer), and the wafer is subsequently divided into the devices (e.g., chips).

For example, International Publication No. 2017/212677 (hereinafter "Patent Document 1") discloses a method of manufacturing a resonance device in which a frequency adjustment process of adjusting a resonant frequency by applying a predetermined drive voltage to a resonator is performed in a divided state.

As for the resonance device that is manufactured by the method disclosed in Patent Document 1, however, it is necessary to connect a probe to a terminal of each of resonance devices to apply the drive voltage for the frequency adjustment process, and it takes time to adjust frequency for all of the resonance devices.

Moreover, even when the frequency adjustment process is performed before division into the resonance devices, it is necessary to connect the probe to the terminal of each of the resonance devices on the wafer to perform the frequency adjustment process. For this reason, it is necessary to provide many probes to perform the frequency adjustment process in a short time. As such, an adjustment apparatus for such has become complicated and has a large size.

SUMMARY OF THE INVENTION

Accordingly, the present invention has been accomplished in view of such circumstances. It is an object of the present invention to provide a resonance device, a collective board, and a method of manufacturing a resonance device that enable work involving energization to be simply carried out in a short time.

In an exemplary aspect, a resonance device is provided that includes a first substrate having a resonator that includes an upper electrode, a second substrate that is disposed such that a first surface faces the first substrate with the resonator put therebetween, a first terminal that is disposed on a second surface of the second substrate and that is electrically connected to the upper electrode, a second terminal that is disposed on the second surface and that applies a reference electric potential to the resonator, and an extended wiring line that is connected to the first terminal electrically and that extends on the second surface to an outer edge.

Moreover, a collective board according to another exemplary aspect is a collective board for manufacturing a resonance device. The collective board includes a first substrate that includes multiple resonators that include respective upper electrodes, a second substrate that is disposed such that a first surface faces the first substrate with the multiple resonators put therebetween, multiple first terminals that are disposed on a second surface of the second substrate and that are electrically connected to the respective upper electrodes of the multiple resonators, multiple second terminals that are disposed on the second surface and that apply a reference electric potential to the respective multiple resonators, and an extended wiring line that connects one first terminal and another first terminal among the multiple first terminals to connect electrically and that extends on the second surface across a division line for division into multiple resonance devices.

Yet further, a method of manufacturing a resonance device according to another exemplary includes preparing multiple resonators that include respective upper electrodes as a first substrate, and a second substrate that has a first surface that faces the first substrate with the multiple resonators put therebetween and a second surface on which multiple first terminals, multiple second terminals that apply a reference electric potential to the respective multiple resonators, and an extended wiring line that electrically connects one first terminal and another first terminal among the multiple first terminals to each other are disposed. The method further includes joining the first substrate and the second substrate to each other, such that the multiple first terminals are electrically connected to the respective upper electrodes of the multiple resonators, and dividing the first substrate and the second substrate along a division line for division into multiple resonance devices. The extended wiring line extends on the second surface of the second substrate across the division line.

According to the exemplary aspects of the present invention, work involving energization is simply carried out in a short time.

BRIEF DESCRIPTION OF DRAWINGS

FIG. 7 schematically illustrates an exploded perspective view of a collective board according to an exemplary embodiment.

FIG. 14 schematically illustrates a side view of the structure of a resonance device illustrated in FIG. 13.

DETAILED DESCRIPTION OF EMBODIMENTS

Exemplary embodiments of the present invention will hereinafter be described. In the following description for the drawings, like or similar components are designated by like or similar reference signs. The drawings are illustrated by way of example, the dimensions and shapes of components are schematically illustrated, and it should not be understood that the technical scope of the present invention is limited to those of the embodiments.

<Resonance Device>

Figure 1:
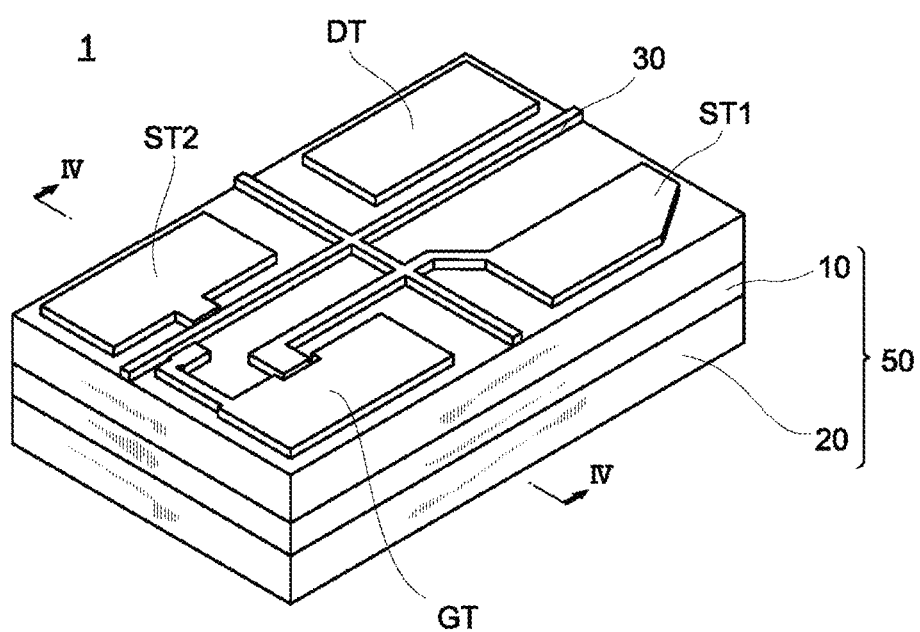
FIG. 1 schematically illustrates a perspective view of a resonance device according to an exemplary embodiment.
Figure 2:
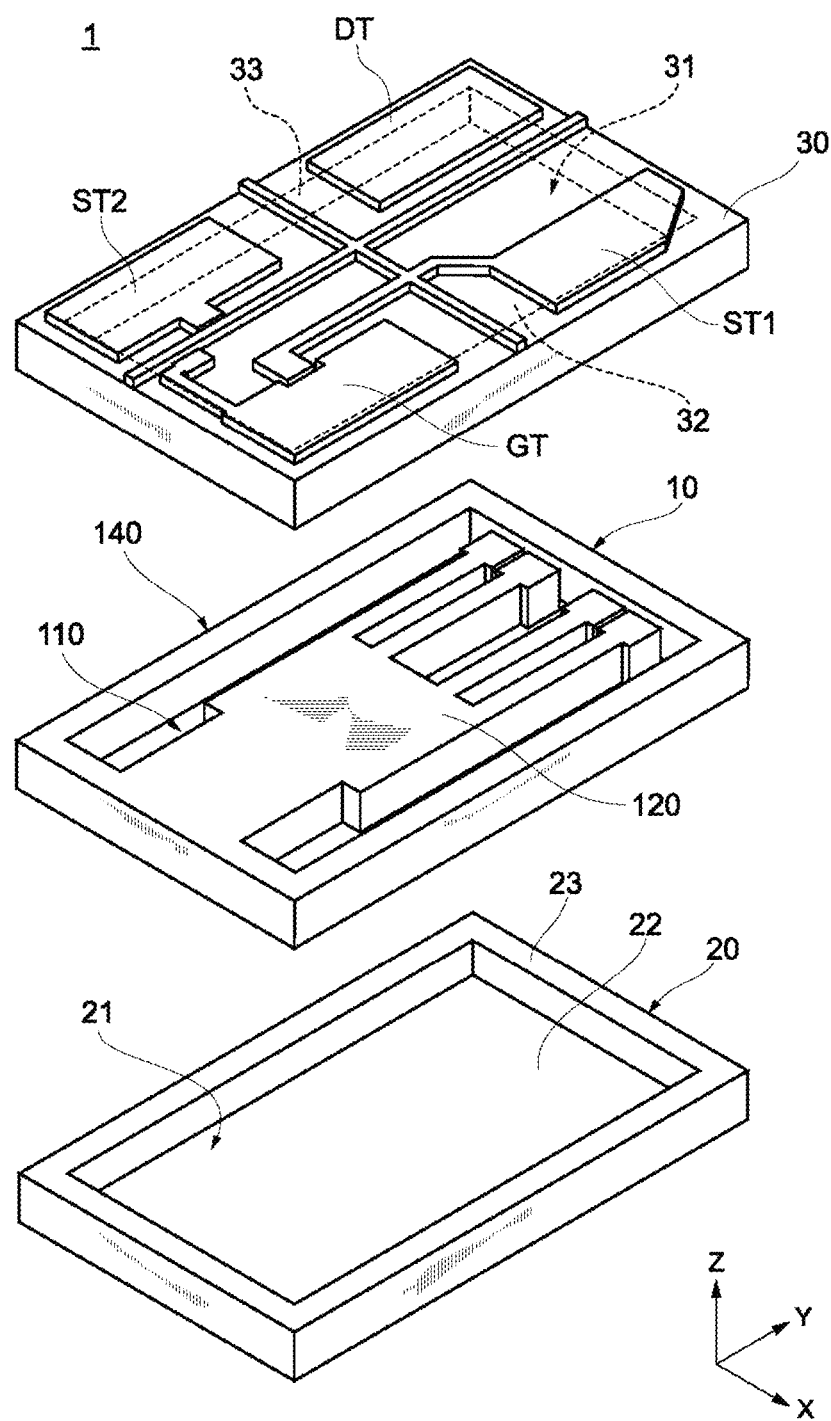
FIG. 2 schematically illustrates an exploded perspective view of the structure of the resonance device illustrated in FIG. 1.

A schematic structure of a resonance device 1 according to an exemplary embodiment will now be described with reference to FIG. 1 and FIG. 2. FIG. 1 schematically illustrates a perspective view of the resonance device 1 according to a first exemplary embodiment. FIG. 2 schematically illustrates an exploded perspective view of the structure of the resonance device 1 illustrated in FIG. 1.

As illustrated in FIG. 1 and FIG. 2, the resonance device 1 includes a resonator 10, and a lower lid 20 and an upper lid 30 that form a vibration space in which the resonator 10 vibrates. That is, the resonance device 1 includes the lower lid 20, the resonator 10, a joint 60 described later, and the upper lid 30 that are stacked in this order. A MEMS substrate 50 (e.g., the lower lid 20 and the resonator 10) according to the present embodiment corresponds to an example of a "first substrate" for purposes of this disclosure. The upper lid 30 according to the present embodiment corresponds to an example of a "second substrate" for purposes of this disclosure.

The structure of the resonance device 1 will be described below. In the following description, the upper lid 30 of the resonance device 1 is disposed on an upper side (or a front side), and the lower lid 20 is disposed on a lower side (or a back side).

Figure 4:
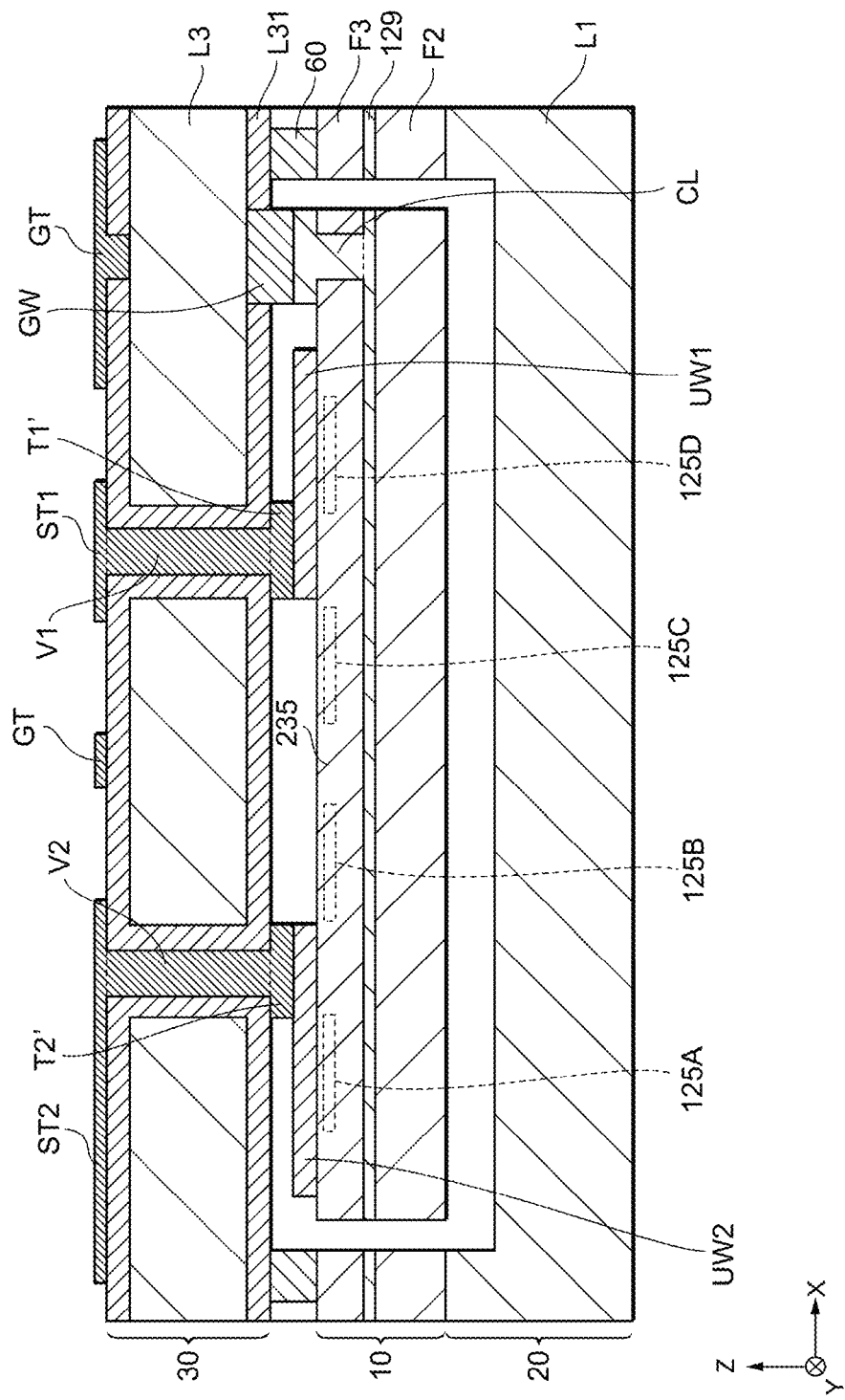
FIG. 4 schematically illustrates a sectional view of the structure of a section of the resonance device illustrated in FIG. 1 to FIG. 3 taken along line IV-IV.

In an exemplary aspect, the resonator 10 is a MEMS vibrator that is manufactured by using a MEMS technique. The resonator 10 and the upper lid 30 are joined to each other with the joint 60 interposed therebetween, as shown in FIG. 4, for example. The resonator 10 and the lower lid 20 are formed by using respective silicon (Si) substrates (referred to below as "Si substrates"). The Si substrates are jointed to each other. The resonator 10 and the lower lid 20 may be formed by using SOI substrates in exemplary aspects.

The upper lid 30 extends along an XY plane into a plate shape. On a back surface thereof, a depressed portion 31 in the form of, for example, a flat rectangular cuboid is formed. The depressed portion 31 is surrounded by a side wall 33 and forms a part of the vibration space in which the resonator 10 vibrates. Moreover, the upper lid 30 may have a plate shape without the depressed portion 31. A getter layer for absorbing an outgassing gas may be formed on a surface of the depressed portion 31 of the upper lid 30 that faces the resonator 10.

Two power terminals ST1 and ST2, a ground terminal GT, and a dummy terminal DT are disposed on a front surface of the upper lid 30. In operation, the power terminals ST1 and ST2 are used to apply a drive signal (a drive voltage) to the resonator 10. The power terminals ST1 and ST2 are electrically connected to upper electrodes 125A, 125B, 125C, and 125D of the resonator 10 described later. The ground terminal GT is used to apply a reference electric potential to the resonator 10. The ground terminal GT is electrically connected to a lower electrode 129 of the resonator 10 described later. On the contrary, the dummy terminal DT is not electrically connected to any component. The power terminal ST1 according to the present embodiment corresponds to an example of a "first terminal" for purposes of this disclosure. The ground terminal GT according to the present embodiment corresponds to an example of a "second terminal" for purposes of this disclosure.

As further shown, the lower lid 20 includes a bottom plate 22 that is disposed along the XY plane and that has a rectangular plate shape and a side wall 23 that extends from a circumferential portion of the bottom plate 22 in a Z-axis direction, that is, a direction in which the lower lid 20 and the resonator 10 are stacked. A depressed portion 21 is formed on a surface of the lower lid 20 that faces the resonator 10 by a front surface of the bottom plate 22 and the inner surface of the side wall 23. The depressed portion 21 forms a part of the vibration space of the resonator 10. In another aspect, the lower lid 20 may have a plate shape without the depressed portion 21. A getter layer for absorbing an outgassing gas may be formed on a surface of the depressed portion 21 of the lower lid 20 that faces the resonator 10.

Figure 3:
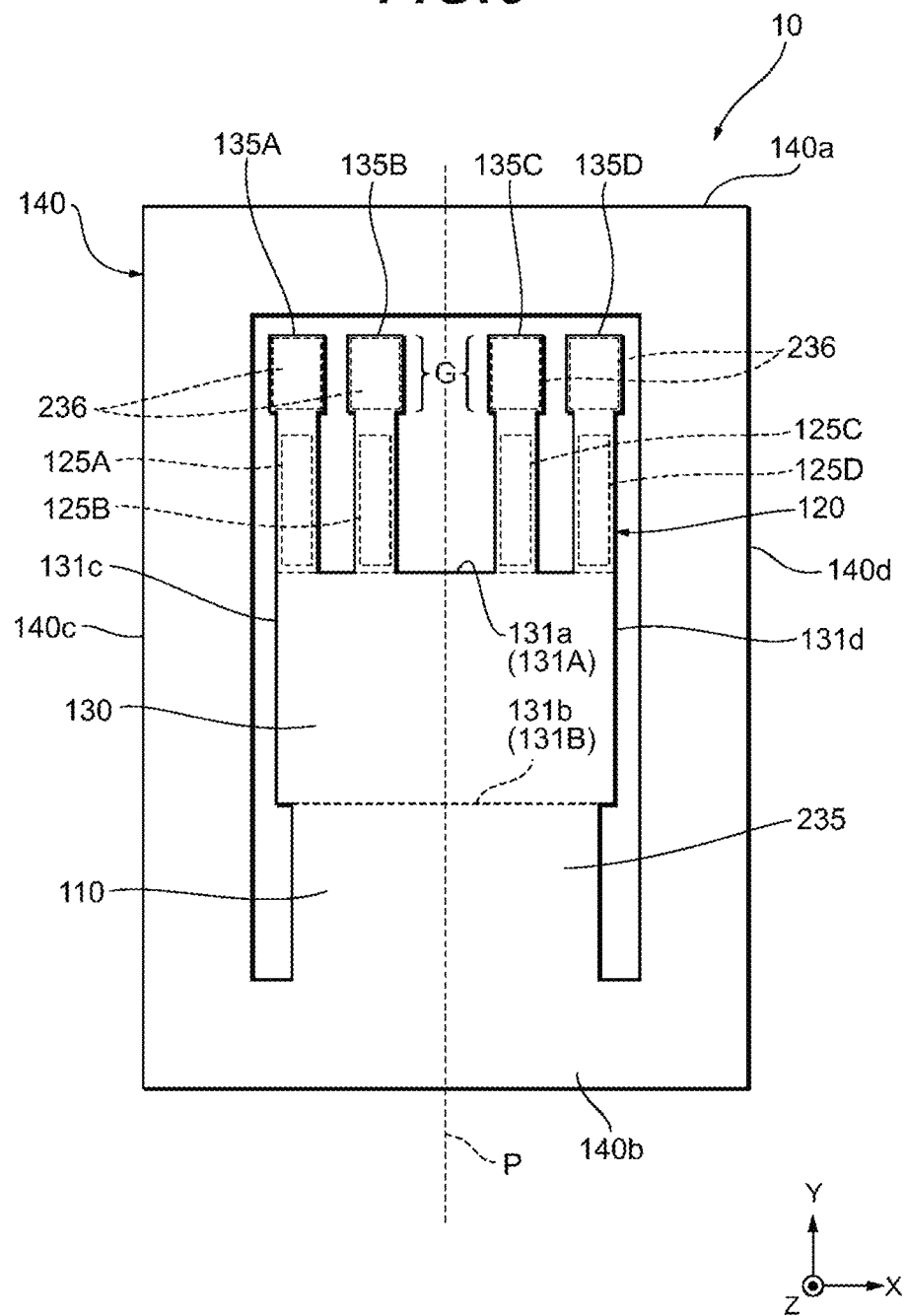
FIG. 3 schematically illustrates a plan view of the structure of a resonator illustrated in FIG. 2.

A schematic structure of the resonator 10 in the resonance device 1 according to an exemplary embodiment will now be described with reference to FIG. 3. FIG. 3 schematically illustrates a plan view of the structure of the resonator 10 illustrated in FIG. 2.

As illustrated in FIG. 3 and in an exemplary aspect, the resonator 10 is the MEMS vibrator that is manufactured by using the MEMS technique, and out-of-plane vibration thereof occurs in the XY plane of a rectangular coordinate system in FIG. 3. However, it is noted that the resonator 10 is not limited to a resonator that operates in an out-of-plane bending vibration mode. For example, the resonator of the resonance device 1 may operate in a broadened vibration mode, a thickness longitudinal vibration mode, a lamb wave vibration mode, an in-plane bending vibration mode, or a surface acoustic wave vibration mode. These vibrators are used for, for example, a timing device, a RF filter, a duplexer, an ultrasonic transducer, a gyro-sensor, or an acceleration sensor. These vibrators may also be used for, for example, a piezoelectric mirror or a piezoelectric gyro-sensor that has an actuator function, an ultrasonic vibration sensor, or a piezoelectric microphone that has a pressure sensor function. These vibrators may also be used for an electrostatic MEMS element, an electromagnetic driving MEMS element, or a piezoelectric resistance MEMS element.

As shown, the resonator 10 includes a vibration member 120 (also referred to as a vibrator), a hold member 140 (also referred to as a frame), and a hold arm 110 (also referred to as a connector or connection arm).

The hold member 140 is formed into a rectangular frame shape so as to surround an outer side portion of the vibration member 120 along the XY plane. For example, the hold member 140 is integrally formed from a frame body that has a prismatic shape. It is noted that the hold member 140 is not limited by the frame shape, provided that the hold member 140 is disposed so as to surround at least a portion around the vibration member 120.

The hold arm 110 is disposed inside the hold member 140 and connects the vibration member 120 and the hold member 140 to each other.

Moreover, the vibration member 120 is disposed inside the hold member 140. A space is formed as a predetermined gap between the vibration member 120 and the hold member 140. In an example illustrated in FIG. 3, the vibration member 120 includes a base 130 and four vibration arms 135A to 135D (also collectively referred to below as "vibration arms 135"). The vibration arms 135 include the four upper electrodes 125A to 125D (also collectively referred to below as "upper electrodes 125"). It is also noted that the number of the vibration arms and the number of the upper electrodes are not limited to 4 but are set to a freely determined numeral of, for example, 3 or more. According to the present embodiment, the vibration arms 135A to 135D and the base 130 are integrally formed.

The base 130 has long sides 131a and 131b in an X-axis direction and short sides 131c and 131d in a Y-axis direction in a plan view of a front surface of the resonator 10 (simply referred to below as "in a plan view"). The long side 131a is a side of a front edge surface (also referred to below as a "front edge 131A") of the base 130. The long side 131b is a side of a rear edge surface (also referred to below as a "rear edge 131B") of the base 130. The front edge 131A and the rear edge 131B of the base 130 face each other.

Moreover, the base 130 is connected to the vibration arms 135 along the front edge 131A and is connected to the hold arm 110 described later along the rear edge 131B. In an example illustrated in FIG. 3, the base 130 has a substantially rectangular shape in a plan view. However, this configuration is not limited thereto, provided that the base 130 is substantially plane-symmetrical to an imaginary plane P that is defined as being along the perpendicular bisector of the long side 131a. For example, the base 130 may have a trapezoidal shape in which the long side 131b is shorter than the long side 131a or a semicircular shape a diameter of which coincides with the long side 131a. moreover, each surface of the base 130 is not limited to a flat surface but may be a curved surface. The imaginary plane P passes through the center of the vibration member 120 in the direction of arrangement of the vibration arms 135.

A base length of the base 130 corresponding to the maximum distance between the front edge 131A and the rear edge 131B in the direction from the front edge 131A toward the rear edge 131B is about 35 μm, for example. A base width corresponding to the maximum distance between the side edges of the base 130 in the width direction perpendicular to the direction of the base length is about 265 μm, for example.

The vibration arms 135 extend in the Y-axis direction and have the same size. Each of the vibration arms 135 is arranged between the base 130 and the hold member 140 so as to be parallel to the Y-axis direction, an end thereof is connected to the front edge 131A of the base 130 and is stationary end, and the other end is an open end. The vibration arms 135 are arranged in parallel at predetermined intervals in the X-axis direction. For example, the widths of the vibration arms 135 in the X-axis direction are about 50 μm, and the lengths thereof in the Y-axis direction are about 450 μm.

For example, as for a portion of each of the vibration arms 135 that extends about 150 μm from the open end, the width in the X-axis direction is greater than that of another portion of the vibration arm 135. The portion having the increased width is referred to as a weight portion G. For example, the width of the weight portion G is greater than that of the other portion of the vibration arm 135 in the X-axis direction by 10 μm in the left-hand direction and by 10 μm in the right-hand direction, and the width in the X-axis direction is about 70 μm. moreover, the weight portion G is integrally formed with the other parts of the vibration arm 135 in the same process according to an exemplary aspect. As a result of the formation of the weight portion G, as for the weight of the vibration arm 135 per unit length, a portion near the open end is heavier than a portion near the stationary end. Accordingly, when each of the vibration arms 135 includes the weight portion G near the open end, the amplitude of vibration in the vertical direction at the vibration arm is increased.

A protection film 235 described later is formed on a front surface (e.g., a surface that faces the upper lid 30) of the vibration member 120 so as to cover the entire surface thereof. Frequency adjustment films 236 are formed on a front surface of the protection film 235 at the respective open ends of the vibration arms 135A to 135D. The protection film 235 and the frequency adjustment films 236 enable the resonant frequency of the vibration member 120 to be adjusted.

According to the present embodiment, substantially the entire front surface (the surface that faces the upper lid 30) of the resonator 10 is covered by the protection film 235. However, it is noted that the protection film 235 is not limited by the structure that covers substantially the entire surface of the resonator 10, provided that at least the vibration arms 135 are covered.

A multilayer structure of the resonance device 1 according to an exemplary embodiment will now be described with reference to FIG. 4. FIG. 4 schematically illustrates a sectional view of the structure of a section of the resonance device 1 illustrated in FIG. 1 to FIG. 3 taken along line IV-IV.

As for the resonance device 1, as illustrated in FIG. 4, the resonator 10 is joined to the lower lid 20, and the resonator 10 and the upper lid 30 are joined to each other. The resonator 10 is thus held between the lower lid 20 and the upper lid 30. Moreover, the vibration space in which the vibration arms 135 vibrate is formed by the lower lid 20, the upper lid 30, and the hold member 140 of the resonator 10.

In an exemplary aspect, the lower lid 20 is integrally formed by using a silicon (Si) wafer (referred to below as a "Si wafer") L1. The thickness of the lower lid 20 that is defined in the Z-axis direction is, for example, about 150 μm. moreover, the Si wafer L1 is composed of silicon that is not degenerate, and the resistivity thereof is, for example, 16 mΩ·cm or more.

In a further exemplary aspect, the hold member 140, the base 130, the vibration arms 135, and the hold arm 110 of the resonator 10 are integrally formed in the same process. As for the resonator 10, the lower electrode 129 is formed on a silicon (Si) substrate (referred to below as a "Si substrate") F2 that is an example of a substrate so as to cover an upper surface of the Si substrate F2. A piezoelectric thin film F3 is formed on the lower electrode 129 so as to cover the lower electrode 129. The upper electrodes 125A, 125B, 125C, and 125D are stacked on the piezoelectric thin film F3. The protection film 235 is stacked on the upper electrodes 125A, 125B, 125C, and 125D so as to cover the upper electrodes 125A, 125B, 125C, and 125D.

The lower electrode 129 is formed on substantially the entire upper surface of the Si substrate F2 and extends to outer edges of the resonator 10. Consequently, the lower electrodes 129 of multiple resonance devices 1 can be electrically connected to each other by connecting the lower electrodes 129 of adjacent resonance devices 1 to each other in a state of a collective board 100 described later before dividing (e.g., chipping).

Moreover, the Si substrate F2 can be composed of, for example, degenerate n-type silicon (Si) semiconductor having a thickness of about 6 μm. The degenerate silicon (Si) can contain a n-type dopant such as phosphorus (P), arsenic (As), or antimony (Sb). The resistance value of the degenerate silicon (Si) that is used for the Si substrate F2 is, for example, less than 16 mΩ·cm, preferably 1.2 mΩ·cm or less. A silicon oxide (for example, $SiO_2$) layer may be formed on at least the upper surface or a lower surface of the Si substrate F2 as an example of a layer for compensating temperature characteristics.

Since the Si substrate F2 is the degenerate silicon (Si), the use of a degenerate silicon substrate having a low resistance value, for example, enables the Si substrate F2 itself to double as the lower electrode and enables the lower electrode 129 to be omitted. In this case, the Si substrates F2 of the multiple resonance devices 1, that is, the lower electrodes can be electrically connected to each other in a manner in which the adjacent resonance devices 1 share the Si substrates F2 in the state of the collective board 100.

In an exemplary aspect, the lower electrode 129 and the upper electrodes 125A, 125B, 125C, and 125D have a thickness of, for example, no less than about 0.1 μm and no more than about 0.2 μm and are patterned into desired shapes, for example, by etching. For the lower electrode 129 and the upper electrodes 125A, 125B, 125C, and 125D, metal the crystal structure of which is a body-centered cubic structure is used. Specifically, the lower electrode 129 and the upper electrodes 125A, 125B, 125C, and 125D are composed of, for example, Mo (molybdenum) or tungsten (W).

In operation, the piezoelectric thin film F3 converts an applied voltage into vibration. The piezoelectric thin film F3 is composed of a material that has a wurtzite hexagon crystal structure, and the main component thereof can be, for example, a nitride or an oxide such as nitride aluminum (AlN), scandium aluminum nitride (ScAlN), zinc oxide (ZnO), gallium nitride (GaN), or indium nitride (InN). The scandium aluminum nitride is obtained by replacing a part of aluminum in nitride aluminum with scandium. For example, the part can be replaced with two elements of magnesium (Mg) and niobium (Nb) or magnesium (Mg) and zirconium (Zr) instead of scandium. The thickness of the piezoelectric thin film F3 is, for example, 1 μm and can be no less than about 0.2 μm and no more than about 2 μm.

The piezoelectric thin film F3 expands and contracts in the in-plane direction of the XY plane, that is, the Y-axis direction depending on an electric field that is applied to the piezoelectric thin film F3 by the lower electrode 129 and the upper electrodes 125A, 125B, 125C, and 125D. Moreover, the expansion and contraction of the piezoelectric thin film F3 cause the vibration arms 135 to shift the open ends thereof toward the inner surfaces of the lower lid 20 and the upper lid 30 and to vibrate in the out-of-plane bending vibration mode.

According to the present embodiment, the phase of an electric field that is applied to the upper electrodes 125A and 125D of the vibration arms 135A and 135D on outer side portions is opposite the phase of an electric field that is applied to the upper electrodes 125B and 125C of the vibration arms 135B and 135C on inner side portions. Consequently, the vibration arms 135A and 135D on the outer side portions and the vibration arms 135B and 135C on the inner side portions shift in opposite directions during operation. For example, when the vibration arms 135A and 135D on the outer side portions shift the free ends toward the inner surface of the upper lid 30, the vibration arms 135B and 135C on the inner side portions shift the free ends toward the inner surface of the lower lid 20.

Yet further, the protection film 235 prevents the upper electrodes 125A, 125B, 125C, and 125D from being oxidized. The protection film 235 is preferably composed of a material that decreases the mass thereof due to etching at a lower rate than that for the frequency adjustment films 236. The rate at which the mass decreases is expressed as a product of an etching rate, that is, a thickness that is removed per unit time and density. Examples of the protection film 235 include a piezoelectric film composed of, for example, nitride aluminum (AlN), scandium aluminum nitride (ScAlN), zinc oxide (ZnO), gallium nitride (GaN), or indium nitride (InN), and an insulating film composed of, for example, silicon nitride (SiN), silicon dioxide ($SiO_2$), or alumina oxide ($Al_2O_3$). The thickness of the protection film 235 is, for example, about 0.2 μm.

The frequency adjustment films 236 are formed on substantially the entire surface of the vibration member 120 and are finally formed only in predetermined regions by being subjected to a process such as etching. The frequency adjustment films 236 are composed of a material that decreases the mass thereof due to etching at a higher rate than that for the protection film 235. Specifically, the frequency adjustment films 236 are composed of metal such as molybdenum (Mo), tungsten (W), gold (Au), platinum (Pt), nickel (Ni), or titanium (Ti), for example.

A relationship in magnitude of the etching rate between the protection film 235 and the frequency adjustment films 236 is freely determined, provided that a relationship in the rate at which the mass decreases is as described above.

As further shown, a conductive layer CL is formed so as to be in contact with the lower electrode 129. Specifically, for connection between the conductive layer CL and the lower electrode 129, a part of the piezoelectric thin film F3 that is stacked on the lower electrode 129 is removed such that the lower electrode 129 is exposed, and a via is formed. The same material as that of the lower electrode 129 is filled in the via, and the lower electrode 129 and the conductive layer CL are connected to each other.

Upper wiring lines UW1 and UW2 are electrically connected to the upper electrodes 125A, 125B, 125C, and 125D. Specifically, the upper wiring line UW1 is electrically connected to the upper electrodes 125B and 125C of the vibration arms 135B and 135C on the inner side portions with a lower wiring line that is not illustrated interposed therebetween. The upper wiring line UW2 is electrically connected to the upper electrodes 125A and 125D of the vibration arms 135A and 135D on the outer side portions with a lower wiring line that is not illustrated interposed therebetween. In an exemplary aspect, the upper wiring lines UW1 and UW2 are composed of, for example, metal such as aluminum (Al), gold (Au), or tin (Sn).

As further shown, the joint 60 is formed into a substantially annular rectangle shape along the XY plane between the resonator 10 and the upper lid 30. The joint 60 joins the MEMS substrate 50 and the upper lid 30 to each other so as to seal the vibration space of the resonator 10. Consequently, the vibration space is sealed in an airtight state, and a vacuum state is maintained.

The joint 60 is conductive and is composed of, for example, metal such as aluminum (Al), germanium (Ge), or an alloy of aluminum (Al) and germanium (Ge) that are bonded by eutectic bonding. The joint 60 may be formed by using, for example, a gold (Au) film and a tin (Sn) film or may be formed by using, for example, a combination of gold (Au) and silicon (Si), a combination of gold (Au) and gold (Au), or a combination of copper (Cu) and tin (Sn). As for the joint 60, titanium (Ti), titanium nitride (TiN), or tantalum nitride (TaN), for example, may be thinly put between stacked layers in order to improve close contact.

As shown, the joint 60 is disposed on an upper surface of the MEMS substrate 50 (e.g., the lower lid 20 and the resonator 10) at a position a predetermined distance, for example, about 20 μm away from an outer edge. This configuration reduces the occurrence of a product failure in the resonance device 1 such as a projection (e.g., a burr) or a droop due to a division failure that can occur when the joint 60 is not the predetermined distance away therefrom.

The upper lid 30 is formed by using a Si wafer L3 having a predetermined thickness. The upper lid 30 is joined to the resonator 10 by using the joint 60 described later in the vicinity thereof (e.g., at the side wall 33). As for the upper lid 30, the upper surface on which the power terminals ST1 and ST2 and the ground terminal GT are disposed, a lower surface that faces the resonator 10, and side surfaces of through-electrodes V1 and V2 are preferably covered by a silicon oxide film L31. The silicon oxide film L31 is formed on the surface of the Si wafer L3 by, for example, oxidation of the surface of the Si wafer L3 or chemical vapor deposition (CVD).

The through-electrodes V1 and V2 are formed by filling through-holes that are formed in the upper lid 30 with a conductive material. Examples of the conductive material to be filled include polycrystalline silicon (Poly-Si) doped with impurities, copper (Cu), gold (Au), and monocrystalline silicon doped with impurities. The through-electrode V1 serves as a wiring line that electrically connects the power terminal ST1 and a terminal T1' to each other. The through-electrode V2 serves as a wiring line that electrically connects the power terminal ST2 and a terminal T2' to each other.

The power terminals ST1 and ST2 and the ground terminal GT are formed on the upper surface (i.e., the surface opposite the surface that faces the resonator 10) of the upper lid 30. The terminals T1' and T2' and the ground wiring line GW are formed on the lower surface (i.e., the surface that faces the resonator 10) of the upper lid 30. The power terminal ST1, a through-electrode V1, and the terminal T1' are electrically insulated from the Si wafer L3 by using the silicon oxide film L31. When the upper lid 30 and the resonator 10 are joined to each other, the terminal T1' and the upper wiring line UW1 are connected to each other. As a result, the power terminal ST1 is electrically connected to the upper wiring line UW1. Since the upper wiring line UW1 is electrically connected to the upper electrodes 125B and 125C as described above, the power terminal ST1 is electrically connected to the upper electrodes 125B and 125C of the resonator 10.

The power terminal ST2 is electrically connected to the upper wiring line UW2 with the through-electrode V2 and the terminal T2' interposed therebetween. The power terminal ST2, the through-electrode V2, and the terminal T2' are electrically insulated from the Si wafer L3 by using the silicon oxide film L31. When the upper lid 30 and the resonator 10 are joined to each other, the terminal T2' and the upper wiring line UW2 are connected to each other. As a result, the power terminal ST2 is electrically connected to the upper wiring line UW2. Since the upper wiring line UW2 is electrically connected to the upper electrodes 125A and 125D as described above, the power terminal ST2 is electrically connected to the upper electrodes 125A and 125D of the resonator 10.

The ground terminal GT that is disposed in the positive direction of the X-axis is formed so as to be in contact with the Si wafer L3. Specifically, a part of the silicon oxide film L31 is removed by being subjected to a process such as etching, and the ground terminal GT is formed on the exposed Si wafer L3. Similarly, the ground wiring line GW is formed so as to be in contact with the Si wafer L3. Specifically, a part of the silicon oxide film L31 is removed by being subjected to a process such as etching, and the ground wiring line GW is formed on the exposed Si wafer L3.

In the exemplary aspect, the ground terminal GT and the ground wiring line GW are composed of, for example, metal such as gold (Au) or aluminum (Al). An annealing process (e.g., a heat treatment) is performed on the metal of the composition. As a result, the ground terminal GT and the ground wiring line GW are in ohmic contact with the Si wafer L3. Consequently, the ground terminal GT and the ground wiring line GW are electrically connected to each other with the Si wafer L3 interposed therebetween.

Since the ground terminal GT is electrically connected to the lower electrode 129 with the ground wiring line GW and the conductive layer CL interposed therebetween, the ground terminal GT readily applies the reference electric potential to the resonator 10.

When the upper lid 30 and the resonator 10 are joined to each other, the ground wiring line GW and the conductive layer CL come into contact with each other. As a result, the ground terminal GT is electrically connected to the conductive layer CL. Since the conductive layer CL is electrically connected to the lower electrode 129 as described above, the ground terminal GT is electrically connected to the lower electrode 129 of the resonator 10.

Moreover, a stray capacitance occurs between the power terminal ST1 and the ground terminal GT. A stray capacitance occurs also between the power terminal ST2 and the ground terminal GT. For example, the area of the wiring line that is extended from the power terminal ST1 differs from the area of the wiring line that is extended from the power terminal ST2. Accordingly, there is a possibility that the stray capacitance between the power terminal ST1 and the ground terminal GT and the stray capacitance between the power terminal ST2 and the ground terminal GT are unbalanced.

Figure 5:
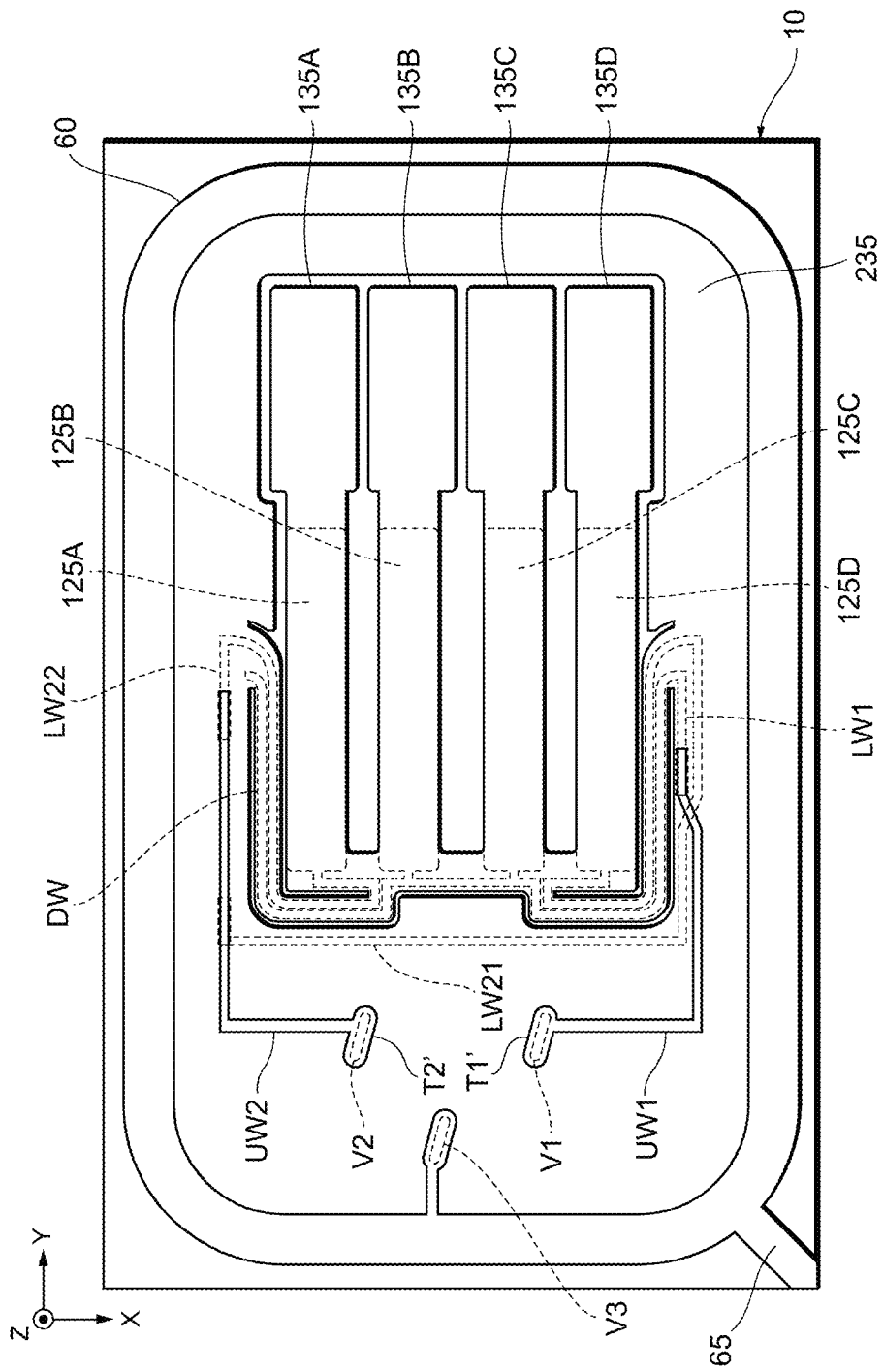
FIG. 5 schematically illustrates a plan view of the resonator and wiring lines in the vicinity thereof illustrated in FIG. 1 to FIG. 4.

The resonator 10 and the wiring lines in the vicinity thereof in the resonance device 1 according to an exemplary embodiment will now be described with reference to FIG. 5. FIG. 5 schematically illustrates a plan view of the resonator 10 and the wiring lines in the vicinity thereof illustrated in FIG. 1 to FIG. 4.

As illustrated in FIG. 5, the terminal T1' electrically connects the through-electrode V1 that is formed on the power terminal ST1 of the upper lid 30 and the upper wiring line UW1 that is formed on the protection film 235 of the resonator 10 to each other. The upper wiring line UW1 is electrically connected to a lower wiring line LW1 that is covered by the protection film 235. The lower wiring line LW1 is extended and is electrically connected to the upper electrode 125B of the vibration arm 135B and the upper electrode 125C of the vibration arm 135C.

Similarly, the terminal T2' electrically connects the through-electrode V2 that is formed on the power terminal ST2 of the upper lid 30 and the upper wiring line UW2 that is formed on the protection film 235 of the resonator 10 to each other. The upper wiring line UW2 is electrically connected to lower wiring lines LW21 and LW22 that are covered by the protection film 235. The lower wiring line LW21 is extended and is electrically connected to the upper electrode 125D of the vibration arm 135D. The lower wiring line LW22 is extended and is electrically connected to the upper electrode 125A of the vibration arm 135A.

As clear from FIG. 5, the upper wiring line UW1 and the lower wiring line LW1 that electrically connect the power terminal ST1 and the upper electrodes 125B and 125C to each other and the upper wiring line UW2 and the lower wiring lines LW21 and LW22 that electrically connect the power terminal ST2 and the upper electrodes 125A and 125D to each other have different lengths (e.g., distances) of extended parts and accordingly have different areas.

As further shown, the lower wiring line LW1 includes a dummy wiring line DW. The dummy wiring line DW is not electrically connected, but instead it is used to maintain the symmetry of the lower wiring line LW1 and to increase the area thereof. Consequently, the symmetry of vibrations of the vibration arms 135 can be maintained, and the unbalance of capacitance due to the areas of the upper wiring line UW1, the lower wiring line LW1, the upper wiring line UW2, and the lower wiring lines LW21 and LW22 can be adjusted by the area of the dummy wiring line DW.

Similarly to the through-electrodes V1 and V2, the through-electrode V3 is formed by filling a through-hole that is formed in the upper lid 30 with a conductive material. Examples of the conductive material to be filled include polycrystalline silicon (Poly-Si) doped with impurities, copper (Cu), gold (Au), and monocrystalline silicon doped with impurities. The through-electrode V3 serves as a wiring line that electrically connects the ground terminal GT that is formed on the upper surface of the upper lid 30 and the joint 60 that is formed into an annular shape on the resonator 10 to each other. Since the ground terminal GT is thus connected to the lower electrode 129 and electrically connected to the joint 60, a stray capacitance that can occur between the joint 60 and the lower electrode 129 in the multilayer structure illustrated in FIG. 4 is reduced.

Figure 9:
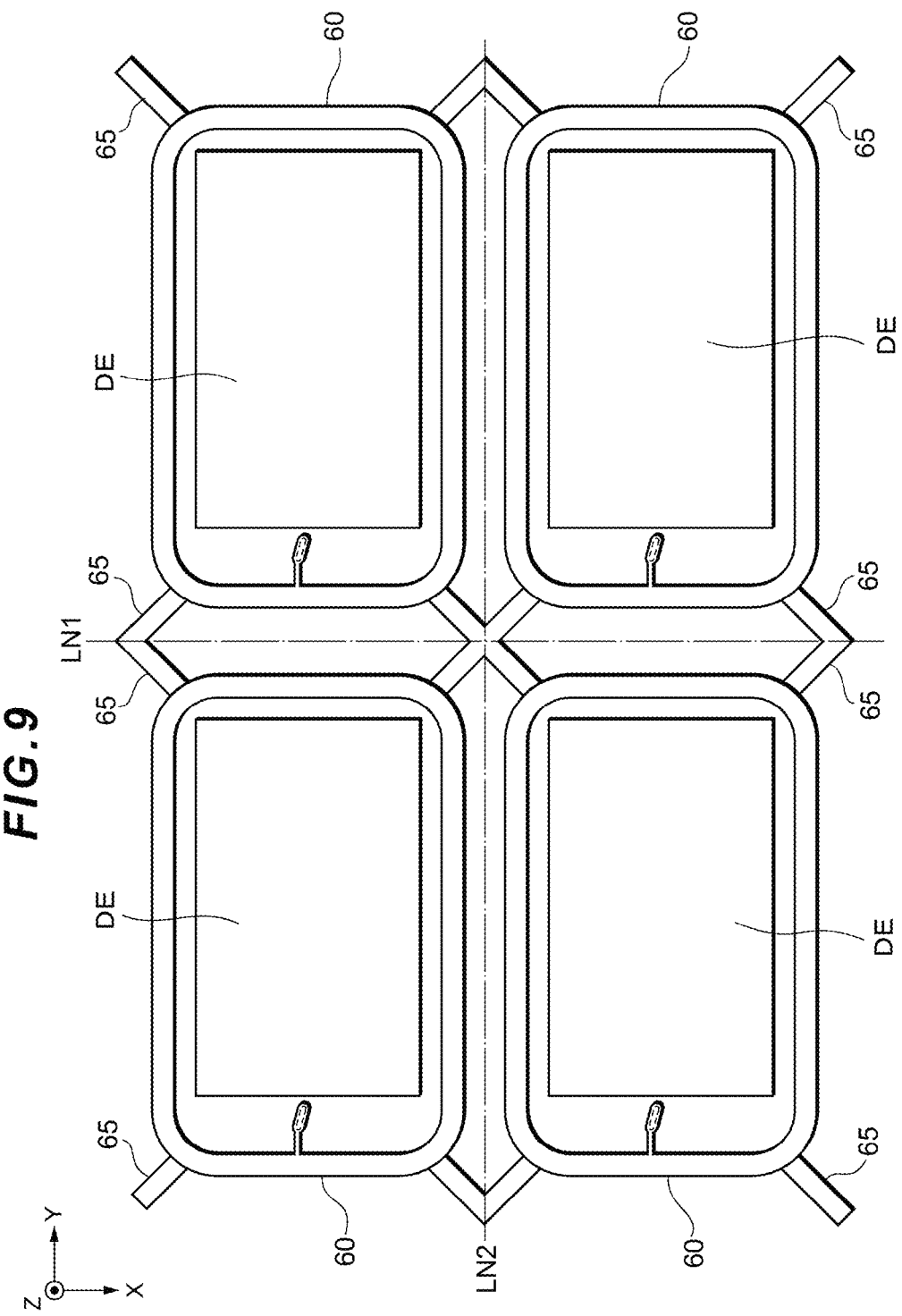
FIG. 9 is an enlarged partial view of a region B illustrated in FIG. 7.

The joint 60 includes a connection member 65 as shown in FIG. 9, for example, as discussed below. In particular, the connection member 65 can be formed at a corner portion of the joint 60 and extends to an outer edge of the resonator 10. Consequently, the lower electrodes 129 can be electrically connected to each other with the connection members 65 interposed therebetween by connecting the connection members 65 of resonance devices 1 that are diagonally disposed to each other in the state of the collective board 100 described later.

It is noted that the connection member 65 is not limited by the case where the connection member 65 is formed at the corner portion of the joint 60. For example, the connection member 65 may project from a long side or a short side of a substantially rectangular shape in a plan view to an outer edge of the resonator 10 in alternative aspects. Moreover, the number of the connection member 65 that is included in the joint 60 is not limited to 1, but may be 2 or more.

The power terminals ST1 and ST2 and the ground terminal GT in the resonance device 1 according to an exemplary embodiment will now be described with reference to FIG. 6.

Figure 6:
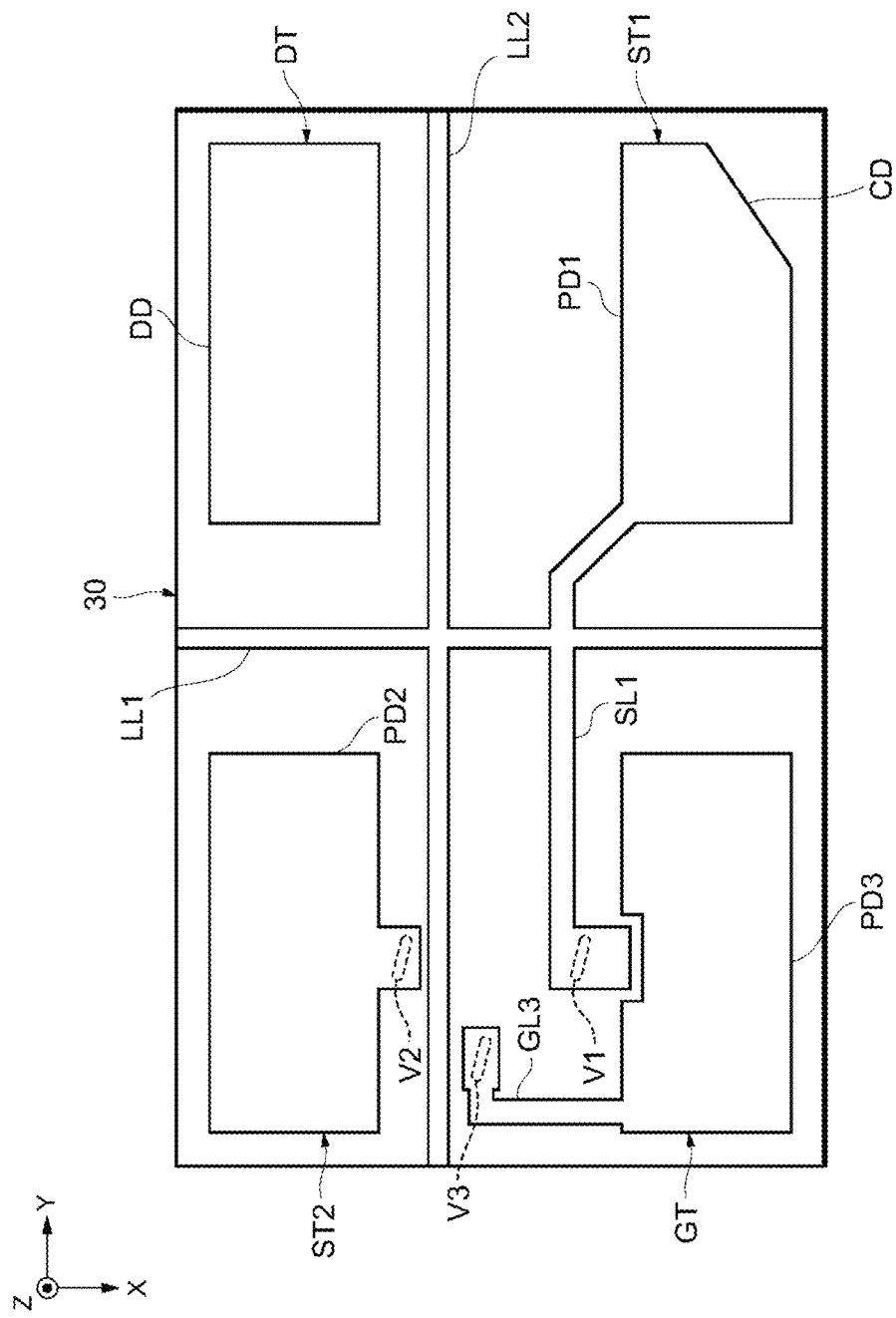
FIG. 6 schematically illustrates a plan view of the structure of power terminals and a ground terminal that are disposed on an upper lid illustrated in FIG. 1 and FIG. 2.

FIG. 6 schematically illustrates a plan view of the structure of the power terminals ST1 and ST2 and the ground terminal GT that are disposed on the upper lid 30 illustrated in FIG. 1 and FIG. 2.

As illustrated in FIG. 6, the power terminal ST1 includes a power pad PD1 and a power wiring line SL1. The power pad PD1 is disposed on the front surface of the upper lid 30 at a corner portion in the positive direction of the X-axis and in the positive direction of the Y-axis. In a plan view (the same as when the front surface of the resonator is viewed in a plan view and simply referred to below as a "plan view" for purposes of this disclosure) of the front surface of the upper lid 30, the power pad PD1 has a shape having a notch CD. Moreover, the power wiring line SL1 has an end portion (i.e., the right-hand end portion in FIG. 6) that is connected to the power pad PD1 and extends to a position near a ground pad PD3 described later. The through-electrode V1 described above is formed at the other end portion (i.e., the left-hand end portion in FIG. 6) of the power wiring line SL1.

Moreover, the power terminal ST2 includes a power pad PD2. The power pad PD2 is disposed on the front surface of the upper lid 30 at a corner portion in the negative direction of the X-axis and in the negative direction of the Y-axis. In a plan view, the power pad PD2 has a substantially rectangular shape. The power pad PD2 includes a portion that protrudes in the positive direction of the X-axis. The through-electrode V2 described above is formed at the portion.

The ground terminal GT includes the ground pad PD3 and a ground wiring line GL3. The ground pad PD3 is disposed on the front surface of the upper lid 30 at a corner portion in the positive direction of the X-axis and in the negative direction of the Y-axis. In a plan view, the ground pad PD3 has a substantially rectangular shape. The ground wiring line GL3 has an end portion (i.e., the right-hand end portion in FIG. 6) that is connected to the power pad PD1, and the through-electrode V3 described above is formed at the other end portion (i.e., the left-hand end portion in FIG. 6).

The dummy terminal DT is not electrically connected to the resonator 10. The dummy terminal DT includes only a dummy pad DD that is disposed on the front surface of the upper lid 30 at a corner portion in the negative direction of the X-axis and in the positive direction of the Y-axis. In a plan view, the dummy pad DD has a substantially rectangular shape in the exemplary aspect.

As clear from FIG. 6, the power terminal ST1 includes the power pad PD1 and the power wiring line SL1, whereas the power terminal ST2 includes only the power pad PD2. Accordingly, the power terminal ST1 and the power terminal ST2 have different areas. More specifically, the area of the power terminal ST1 and the area of the power terminal ST2 differ from each other such that capacitance between the power terminal ST1 and the ground terminal GT approximates to capacitance between the power terminal ST2 and the ground terminal GT. Consequently, the absolute value of a difference between the capacitance between the power terminal ST1 and the ground terminal GT and the capacitance between the power terminal ST2 and the ground terminal GT decreases. Accordingly, the capacitance between the power terminal ST1 and the ground terminal GT and the capacitance between the power terminal ST2 and the ground terminal GT can be inhibited from being unbalanced.

In a plan view, the power pad PD2 of the power terminal ST2 has a substantially rectangular shape, whereas the power pad PD1 of the power terminal ST1 has a shape having the notch CO. Since the shape of the power terminal ST1 and the shape of the power terminal ST2 thus differ from each other, the power terminal ST1 and the power terminal ST2 that have different areas can be readily provided.

In addition, extended wiring lines LL1 and LL2 are formed on the front surface of the upper lid 30. The extended wiring line LL1 is connected to the power wiring line SL1 of the power terminal ST1 on the front surface of the upper lid 30. The extended wiring line LL1 is connected also to the extended wiring line LL2 on the front surface of the upper lid 30. The extended wiring line LL1 extends from an outer edge (i.e., an upper edge in FIG. 6) of the front surface of the upper lid 30 to another outer edge (i.e., a lower edge in FIG. 6). The extended wiring line LL2 extends from another outer edge (i.e., the left-hand edge in FIG. 6) of the front surface of the upper lid 30 to another outer edge (i.e., the right-hand edge in FIG. 6). Consequently, the upper electrodes 125 of the multiple resonance devices 1 can be electrically connected to each other with the power terminals ST1 and the extended wiring lines LL1 and LL2 interposed therebetween by connecting the extended wiring lines LL1 and LL2 of the adjacent resonance devices 1 to each other in the state of the collective board 100 described later before dividing (e.g., chipping). Accordingly, the multiple resonance devices 1 can be collectively energized by bringing two probes into contact with the power terminal ST1 and the ground terminal GT, and work involving energization frequency adjustment or electric connection inspection can be simply carried out in a short time.

In an example illustrated in FIG. 6, two wiring lines of the extended wiring line LL1 and the extended wiring line LL2 are formed on the front surface of the upper lid 30, but this configuration is not a limitation to the exemplary aspect. For example, a single extended wiring line or three or more extended wiring lines, for example, may be provided in alternative aspects.

<Collective Board>

Figure 8:
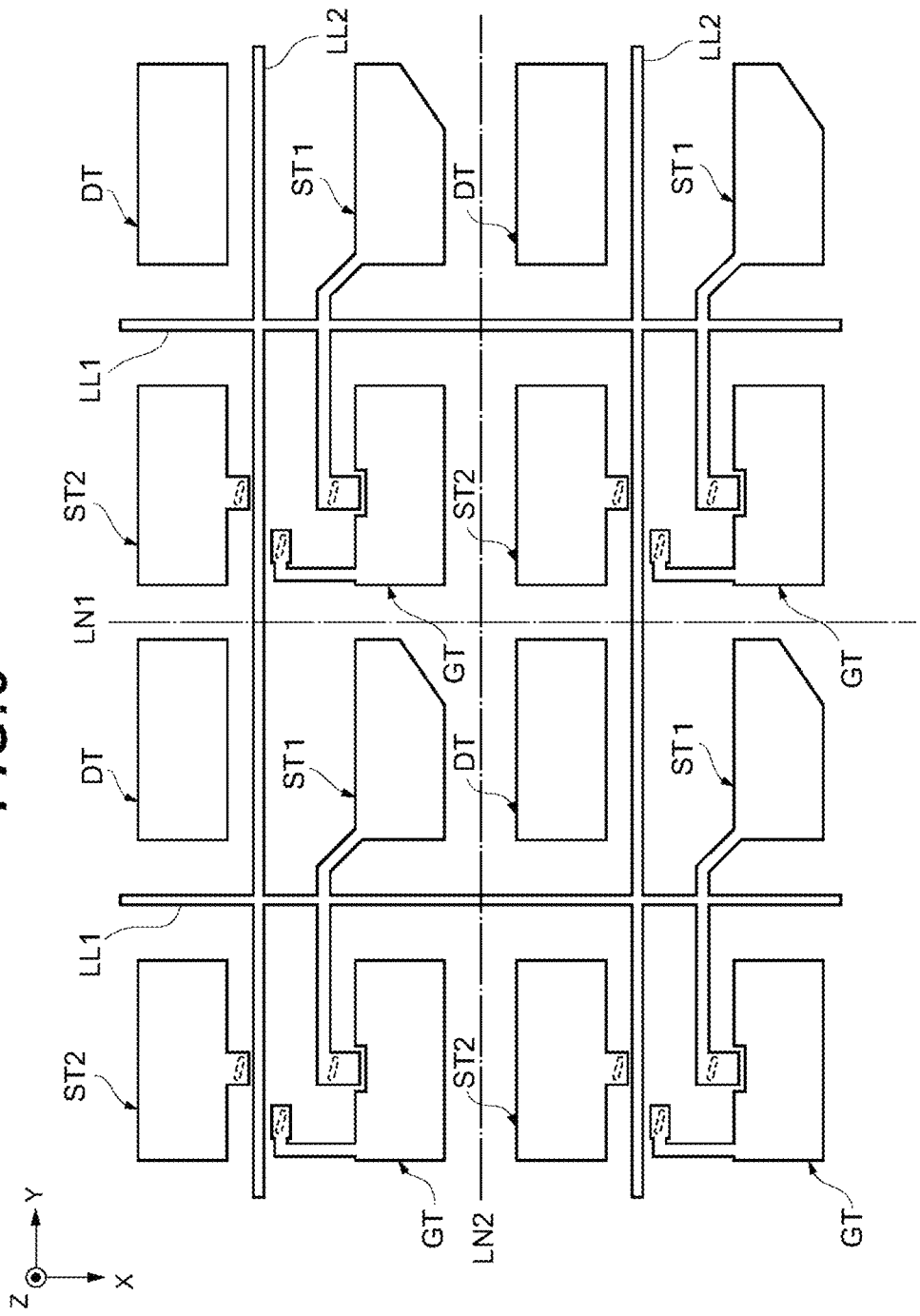
FIG. 8 is an enlarged partial view of a region A illustrated in FIG. 7.

A schematic structure of the collective board 100 according to an embodiment of the present invention will now be described with reference to FIG. 7 to FIG. 9. FIG. 7 schematically illustrates an exploded perspective view of the collective board 100 according to an embodiment. FIG. 8 is an enlarged partial view of a region A illustrated in FIG. 7. FIG. 9 is an enlarged partial view of a region B illustrated in FIG. 7. A division line LN1 illustrated in FIG. 8 corresponds to a division line LN1 illustrated in FIG. 9. A division line LN2 illustrated in FIG. 8 corresponds to a division line LN2 illustrated in FIG. 9.

The collective board 100 according to the present embodiment is used to manufacture the resonance device 1 described above. As illustrated in FIG. 7, the collective board 100 includes an upper substrate 13 and a lower substrate 14. As shown, the upper substrate 13 and the lower substrate 14 each have a circular shape in a plan view. The lower substrate 14 includes multiple resonators 10. The upper substrate 13 is disposed such that the lower surface faces the lower substrate 14 with the multiple resonators 10 put therebetween. The lower substrate 14 according to the present embodiment corresponds to an example of the "first substrate" according to the present disclosure. The upper substrate 13 according to the present embodiment corresponds to an example of the "second substrate" according to the present disclosure.

As illustrated in FIG. 8, multiple power terminals ST1 and ST2, multiple ground terminals GT, and multiple dummy terminals DT are formed on an upper surface of the upper substrate 13. Four-terminal sets of the power terminals ST1, the power terminals ST2, the ground terminals GT, and the dummy terminals DT are arranged in an array on the entire upper surface of the upper substrate 13. Specifically, the sets are arranged in a row direction (i.e., the direction along the Y-axis in FIG. 8) and in a column direction (i.e., the direction along the X-axis in FIG. 8) at predetermined intervals.

As shown, multiple extended wiring lines LL1 and LL2 are formed on the upper surface of the upper substrate 13. Each extended wiring line LL1 is electrically connected to the power terminals ST1 and extends in the column direction (the direction along the X-axis in FIG. 8). Each extended wiring line LL2 is electrically connected to the extended wiring lines LL1 and extends in the row direction (the direction along the Y-axis in FIG. 8).

The division lines LN1 and LN2 illustrated in FIG. 8 are used to divide the collective board 100, that is, the upper substrate 13 and the lower substrate 14 into the multiple resonance devices 1, for example, by cutting and are also referred to as scribe lines. The widths of the division lines LN1 and LN2 are, for example, no less than 5 µm and no more than 20 µm.

On the upper surface of the upper substrate 13, each extended wiring line LL1 extends across the division line LN2 parallel to the Y-axis, and each extended wiring line LL2 extends across the division line LN1 parallel to the X-axis. Consequently, the upper electrodes 125 of the multiple resonance devices 1 can be electrically connected to each other with the power terminals ST1 and the extended wiring lines LL1 and LL2 interposed therebetween by connecting the extended wiring lines LL1 and LL2 of the adjacent resonance devices 1 to each other in the state of the collective board 100 before dividing (e.g., chipping).

As illustrated in FIG. 9, multiple devices DE and multiple joints 60 are formed on an upper surface of the lower substrate 14. Each device DE corresponds to a principal part of the resonator 10 described above such as the vibration member 120 and the hold arm 110. As further shown, each joint 60 is disposed in a region of the hold member 140 of the resonator 10. As described above, the joints 60 include the connection members 65 at respective corner portions of a rectangular shape. Sets of the devices DE and the joints 60 are arranged in an array on the entire upper surface of the lower substrate 14. Specifically, the sets are arranged in the row direction (e.g., a direction along the Y-axis in FIG. 9) and in the column direction (e.g., a direction along the X-axis in FIG. 9) at predetermined intervals.

Each connection member 65 extends across the division lines LN1 and LN2. That is, the connection member 65 of a joint is connected to the connection member 65 of the joint 60 a corner portion of which faces a corner portion of the joint among multiple adjacent joints 60. As a result, the multiple joints 60 are electrically connected to each other by using the connection members 65.

<Method of Manufacturing MEMS Device>

Figure 10:
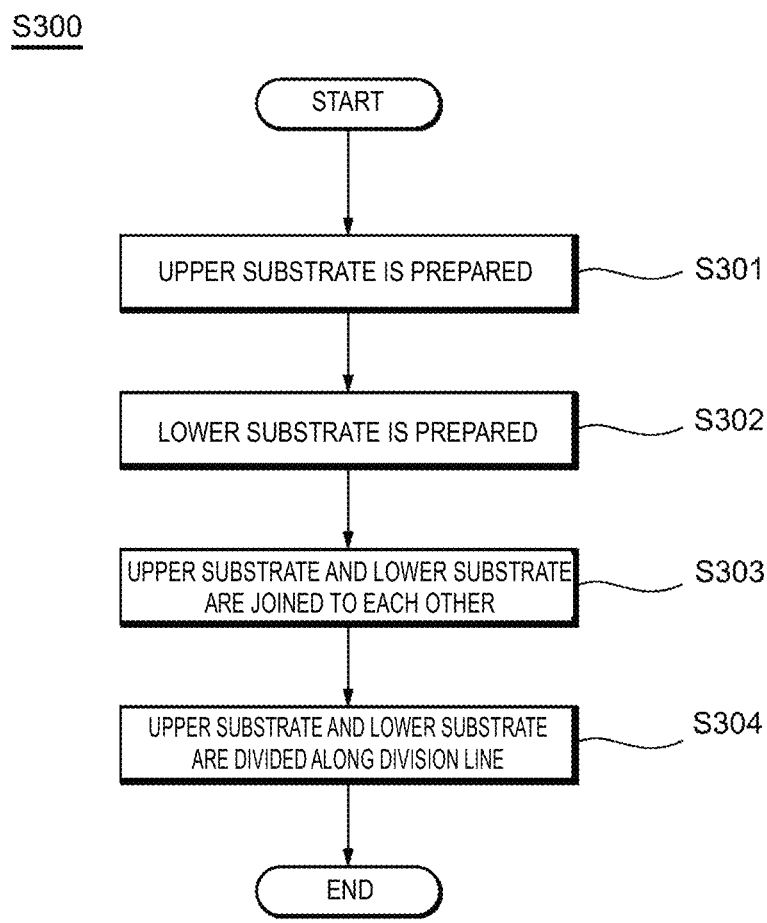
FIG. 10 is a flowchart illustrating a method of manufacturing a resonance device according to an exemplary embodiment.

A method of manufacturing the resonance device 1 according to an exemplary embodiment will now be described. FIG. 10 is a flowchart illustrating a method of manufacturing the resonance device 1 according to an exemplary embodiment.

As illustrated in FIG. 10, the upper substrate 13 corresponding to the upper lid 30 of the resonance device 1 is first prepared (S301).

The upper substrate 13 is formed by using a Si substrate. Specifically, the upper substrate 13 is formed by using the Si wafer L3 having a predetermined thickness illustrated in FIG. 4. The front surface and the back surface (the surface that faces the resonator 10) of the Si wafer L3 and the side surfaces of the through-electrodes V1, V2, and V3 are covered by the silicon oxide film L31. The silicon oxide film L31 is formed on the surface of the Si wafer L3 by, for example, oxidation of the surface of the Si wafer L3 or chemical vapor deposition (CVD).

The multiple power terminals ST1 and ST2, the multiple ground terminals GT, the multiple dummy terminals DT, and the multiple extended wiring lines LL1 and LL2 are formed on the upper surface of the upper substrate 13. Specifically, the multiple power terminals ST1 and ST2, the multiple ground terminals GT, the multiple dummy terminals DT, and the multiple extended wiring lines LL1 and LL2 are formed on the silicon oxide film L31. In the exemplary aspect as described above, the multiple power terminals ST1 and ST2, the multiple ground terminals GT, the multiple dummy terminals DT, and the multiple extended wiring lines LL1 and LL2 are composed of, for example, metal such as gold (Au) or aluminum (Al).

As illustrated in FIG. 8, on the upper surface of the upper substrate 13, each extended wiring line LL1 extends across the division line LN2 parallel to the Y-axis, and each extended wiring line LL2 extends across the division line LN1 parallel to the X-axis. Consequently, the extended wiring lines LL1 and LL2 of the adjacent resonance devices 1 are connected to each other in the state of the collective board 100 before dividing (e.g., chipping), and the upper electrodes 125 of the multiple resonance devices 1 can be electrically connected to each other with the power terminals ST1 and the extended wiring lines LL1 and LL2 interposed therebetween.

Moreover, the through-electrodes V1 and V2 illustrated in FIG. 4 and the through-electrode V3 illustrated in FIG. 5 are formed by filling the through-holes that are formed in the upper substrate 13 with a conductive material. Examples of the conductive material to be filled include polycrystalline silicon (Poly-Si) doped with impurities, copper (Cu), gold (Au), and monocrystalline silicon doped with impurities.

The terminals T1' and T2' and the ground wiring line GW are formed on the lower surface of the upper substrate 13.

Subsequently, the lower substrate 14 corresponding to the MEMS substrate 50 (e.g., the resonator 10 and the lower lid 20) of the resonance device 1 is prepared (S302).

As for the lower substrate 14, Si substrates are joined to each other. The lower substrate 14 may be formed by using an SOI substrate in an alternative aspect. As illustrated in FIG. 4, the lower substrate 14 includes the Si wafer L1 and the Si substrate F2.

The lower electrode 129, the piezoelectric thin film F3, the upper electrodes 125A, 125B, 125C, and 125D, and the protection film 235 are stacked on the upper surface of the Si substrate F2. Each joint 60 is formed on the piezoelectric thin film F3 along the division lines LN1 and LN2 illustrated in FIG. 9 so as to be a predetermined distance away therefrom.

The conductive layer CL and the upper wiring lines UW1 and UW2 are formed on the piezoelectric thin film F3 in addition to the joint 60. It is noted that manufacturing processing can be simplified in a manner in which the same kind of metal as that of the joint 60 is used as the materials of the upper wiring lines UW1 and UW2.

In an example described according to the present embodiment, the joint 60 and the upper wiring lines UW1 and UW2 are formed on the upper surface of the lower substrate 14, but are not limited thereto. For example, at least the joint 60 or the upper wiring lines UW1 and UW2 may be formed on the lower surface of the upper substrate 13. When the joint 60 is composed of multiple materials, a material of the joint 60, for example, germanium (Ge) may be formed on the lower surface of the upper substrate 13, and the remaining material of the joint 60, for example, aluminum (Al) may be formed on the upper surface of the lower substrate 14. Similarly, when the upper wiring lines UW1 and UW2 are composed of multiple materials, a material of the upper wiring lines UW1 and UW2 may be formed on the lower surface of the upper substrate 13, and the remaining material of the upper wiring lines UW1 and UW2 may be formed on the upper surface of the lower substrate 14.

In an example described according to the present embodiment, the lower substrate 14 is prepared at the step S302 after the upper substrate 13 is prepared at the step S301, but this is not a limitation. For example, the order may be changed, and the upper substrate 13 may be prepared after the lower substrate 14 is prepared, or the preparation of the upper substrate 13 and the preparation of the lower substrate 14 may be made in parallel.

Subsequently, the upper substrate 13 prepared at the step S301 and the lower substrate 14 prepared at the step S302 are joined to each other (S303).

Specifically, the lower surface of the upper substrate 13 and the upper surface of the lower substrate 14 are joined by eutectic bonding by using each joint 60 in the exemplary aspect. The positions of the upper substrate 13 and the lower substrate 14 are adjusted such that the terminals T1' and T2' and the upper wiring lines UW1 and UW2 are in contact with each other as illustrated in FIG. 4. After the positions are adjusted, the upper substrate 13 and the lower substrate 14 are sandwiched by using, for example a heater, and a heat treatment for eutectic bonding is performed. The temperature at which the heat treatment for eutectic bonding is performed is equal to or more than a confocal temperature, for example, 424° C. or more, and heating time is, for example, no less than about 10 minutes and no more than about 20 minutes. During heating, the upper substrate 13 and the lower substrate 14 are pressed at a pressure of, for example, no less than about 5 MPa and no more than about 25 MPa. In this way, the joint 60 provides eutectic bonding between the lower surface of the upper substrate 13 and the upper surface of the lower substrate 14.

Subsequently, the upper substrate 13 and the lower substrate 14 are divided along the division lines LN1 and LN2 (S304).

The upper substrate 13 and the lower substrate 14 may be divided by cutting the upper substrate 13 and the lower substrate 14 with a dicing saw or by cutting the upper substrate 13 and the lower substrate 14 with a dicing machine by using a stealth dicing technique in which a laser light is focused, and a modification layer is formed in a substrate.

At the step S304, the upper substrate 13 and the lower substrate 14 are divided along the division lines LN1 and LN2, and the upper substrate 13 and the lower substrate 14 are consequently divided into individual resonance devices 1 (e.g., chips) each of which includes the upper lid 30 and the MEMS substrate 50 (e.g., the lower lid 20 and the resonator 10).

Modifications to the exemplary embodiments described above will now be described. Components like or similar to the components illustrated in FIG. 1 to FIG. 10 are designated by like or similar reference signs, and the description thereof is appropriately omitted. The same actions and effects achieved by the same structures are not described.

(First Modification)

Figure 11:
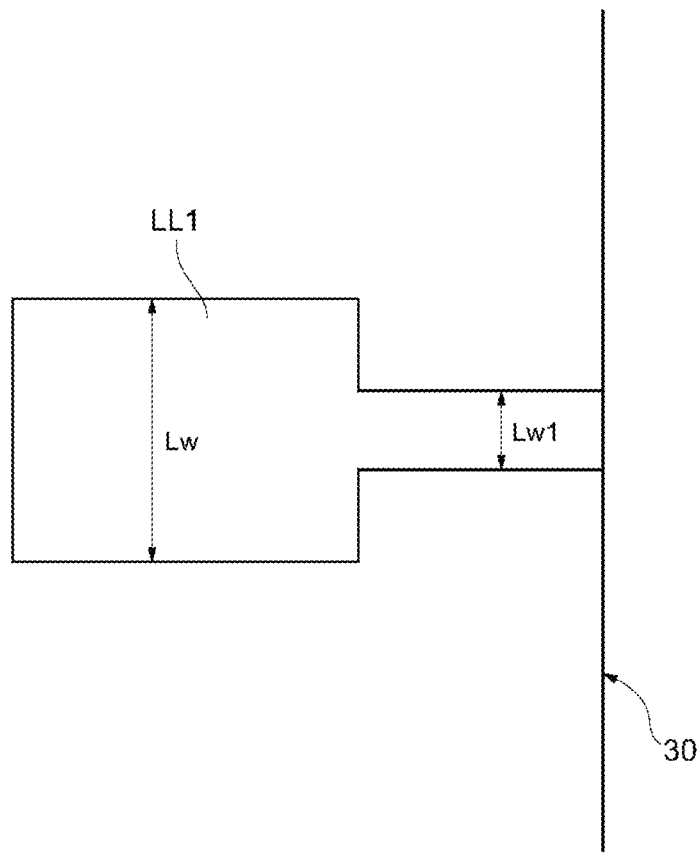
FIG. 11 is an enlarged partial view of an extended wiring line near an outer edge of the upper surface of an upper lid illustrated in FIG. 6.
Figure 12:
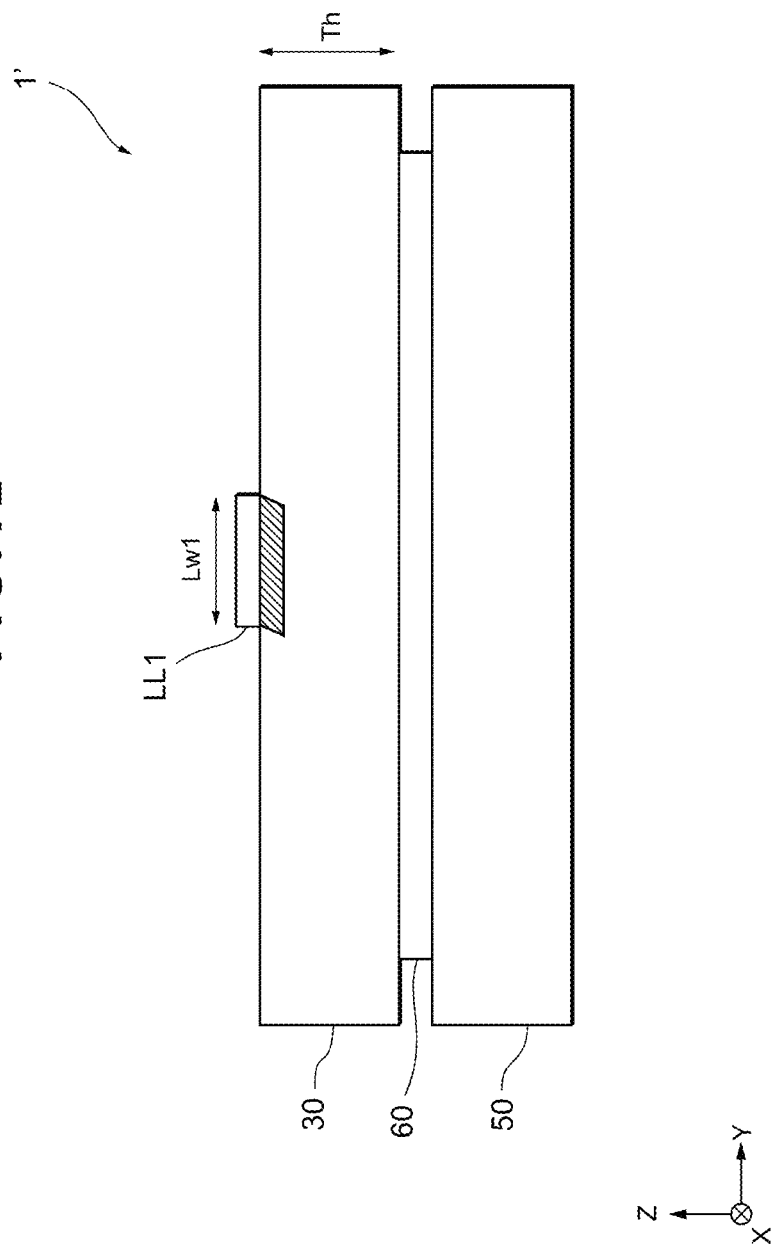
FIG. 12 schematically illustrates a side view of the structure of a resonance device illustrated in FIG. 11.

FIG. 11 is an enlarged partial view of the extended wiring line LL1 near an outer edge of the upper surface of the upper lid 30 illustrated in FIG. 6. FIG. 12 schematically illustrates a side view of the structure of a resonance device 1' illustrated in FIG. 11.

As illustrated in FIG. 11, the extended wiring line LL1 that is included in the resonance device 1' has a predetermined width in a plan view. Specifically, the extended wiring line LL1 has a line width Lw at a portion away from the outer edge of the upper lid 30. The extended wiring line LL1 has a line width Lw1 less than the line width Lw at a portion on the outer edge of the upper lid 30. Consequently, even when a droop occurs on the extended wiring line LL1 at the outer edge due to cutting with a dicing machine during dividing (e.g., chipping), the degree of the droop can be reduced because the line width Lw1 has a small value, and a risk of a short circuit between the droop and the resonator 10, a part of the joint 60, or another part can be reduced.

As illustrated in FIG. 12, the upper lid 30 that is included in the resonance device 1' has a thickness Th in the Z-axis direction. The line width Lw1 of the extended wiring line LL1 at the portion on the outer edge of the upper lid 30 is less than the thickness Th of the upper lid 30. Consequently, even when a droop occurs on the extended wiring line LL1 at the outer edge due to cutting with a dicing machine during dividing (e.g., chipping), the length of the droop with respect to the thickness Th of the upper lid 30 can be reduced, and the risk of a short circuit between the droop and the resonator 10, a part of the joint 60, or another part can be reduced.

(Second Modification)

Figure 13:
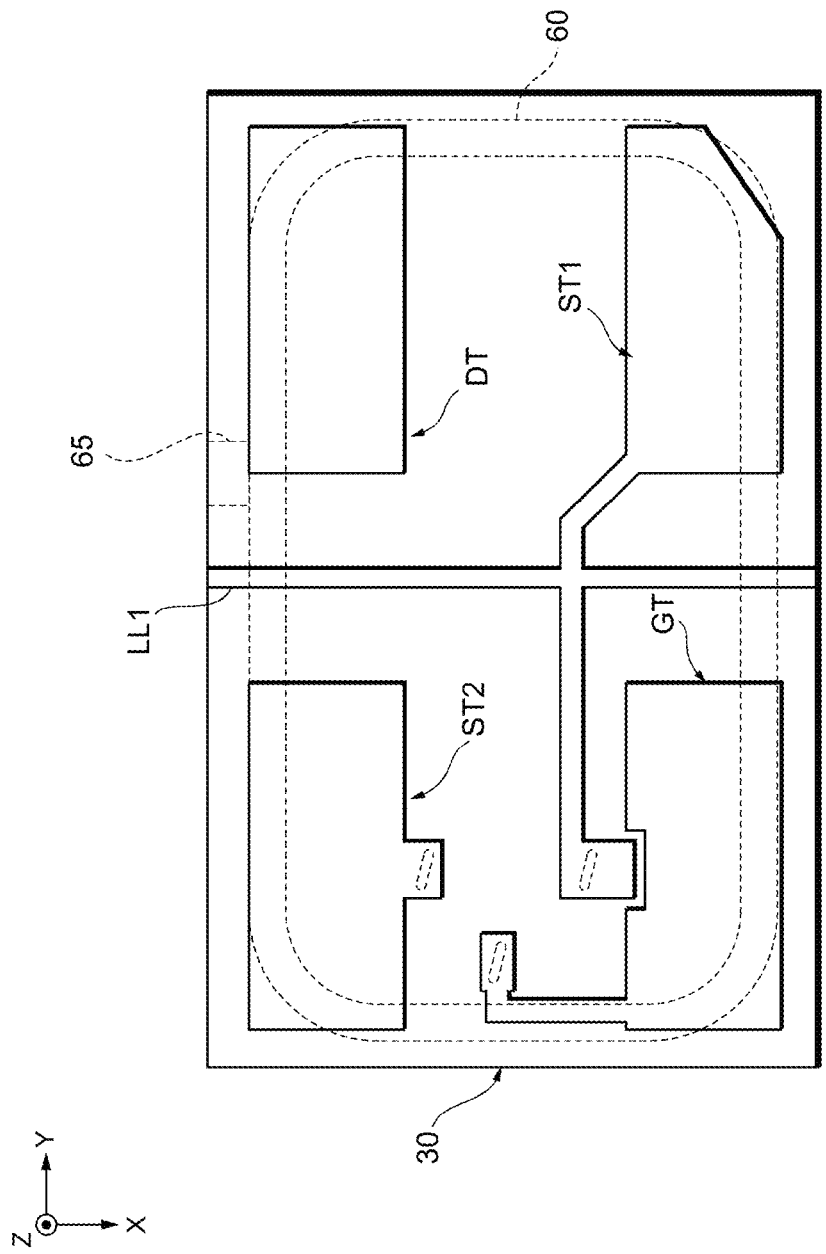
FIG. 13 schematically illustrates a plan view of the arrangement of the extended wiring line and a connection member of a joint illustrated in FIG. 6.

FIG. 13 schematically illustrates a plan view of the arrangement of the extended wiring line LL1 illustrated in FIG. 6 and the connection member 65 of the joint 60. FIG. 14 schematically illustrates a side view of the structure of a resonance device 1" illustrated in FIG. 13.

As illustrated in FIG. 13, the extended wiring line LL1 that is formed on the upper surface of the upper lid 30 extends in the X-axis direction from an outer edge (e.g., an upper edge in FIG. 12) of the upper lid 30 to another outer edge (e.g., a lower edge in FIG. 13).

In a plan view, the connection member 65 that is formed on the lower surface of the upper lid 30 projects in the X-axis direction from the joint 60 and extends to the outer edge (e.g., the upper edge in FIG. 12) of the upper lid 30. Moreover, the connection member 65 is formed at a position away from the extended wiring line LL1 in the positive direction of the Y-axis.

Since the extended wiring line LL1 and the connection member 65 are thus disposed such that the position of the extended wiring line LL1 at the outer edge differs from the position of the connection member 65 at the outer edge in a plan view, even when a droop of the extended wiring line LL1 occurs due to cutting with a dicing machine during dividing (e.g., chipping) as illustrated in FIG. 14, the risk of a short circuit between the droop and the connection member 65 can be reduced.

In general, it is noted that the exemplary embodiments of the present invention are described above by way of example. As for a resonance device according to an exemplary embodiment, an extended wiring line extends from an outer edge of a front surface of an upper lid to another outer edge. Consequently, upper electrodes of multiple resonance devices can be electrically connected to each other with power terminals and the extended wiring lines interposed therebetween by connecting the extended wiring lines of adjacent resonance devices to each other in the state of a collective board before dividing (e.g., chipping). Accordingly, the multiple resonance devices can be collectively energized by bringing two probes into contact with a power terminal and a ground terminal, and work involving energization such as frequency adjustment or electric connection inspection can be simply carried out in a short time.

As for the resonance device described above, the ground terminal is electrically connected to a lower electrode with a ground wiring line and a conductive layer interposed therebetween. Consequently, the ground terminal readily applies the reference electric potential to a resonator.

As for the resonance device described above, the lower electrode extends to an outer edge of the resonator. Consequently, the lower electrodes of the multiple resonance devices can be electrically connected to each other by connecting the lower electrodes of the adjacent resonance devices to each other in the state of the collective board before dividing (e.g., chipping). Accordingly, it is easy for the multiple resonance devices to be collectively energized.

As for the resonance device described above, the ground terminal is electrically connected to a joint. Consequently, a stray capacitance that can occur between the joint and the lower electrode in the multilayer structure illustrated in FIG. 4 can be reduced. The joint includes a connection member. The connection member extends to an outer edge of the resonator. Consequently, the lower electrodes can be connected to each other with the joints interposed therebetween by connecting the connection members of resonance devices that are diagonally disposed to each other in the state of the collective board 100. Accordingly, it is easy for the multiple resonance devices to be collectively energized.

As for the resonance device described above, the extended wiring line and the connection member are disposed such that the position of the extended wiring line at the outer edge differs from the position of the connection member at the outer edge in a plan view. Consequently, as illustrated in FIG. 14, even when a droop of the extended wiring line occurs due to cutting with a dicing machine during dividing (e.g., chipping), the risk of a short circuit between the droop and the connection member 65 can be reduced.

As for the resonance device described above, a Si substrate is a degenerate silicon (Si). Consequently, the use of a degenerate silicon substrate having a low resistance value, for example, enables the Si substrate itself to double as the lower electrode and enables the lower electrode to be omitted. In this case, Si substrates of the multiple resonance devices, that is, the lower electrodes can be electrically connected to each other in a manner in which the adjacent resonance devices share the Si substrates in the state of the collective board. Accordingly, it is easy for the multiple resonance devices to be collectively energized.

As for the resonance device described above, the line width of the extended wiring line at the outer edge is less than the line width at any position other than the outer edge. Consequently, even when a droop occurs on the extended wiring line at the outer edge due to cutting with a dicing machine during dividing (e.g., chipping), the degree of the droop can be reduced because the line width has a small value, and the risk of a short circuit between the droop and the resonator, a part of the joint, or another part can be reduced.

As for the resonance device described above, the line width of the extended wiring line LL1 at the outer edge is less than the thickness of the upper lid. Consequently, even when a droop occurs on the extended wiring line at the outer edge due to cutting with a dicing machine during dividing (e.g., chipping), the length of the droop with respect to the thickness of the upper lid can be reduced, and the risk of a short circuit between the droop and the resonator, a part of the joint, or another part can be reduced.

As for a collective board according to an embodiment of the present invention, an extended wiring line extends across a division line for division into multiple resonance devices. Consequently, the extended wiring lines of the adjacent resonance devices are connected to each other in the state of the collective board before dividing (e.g., chipping), and upper electrodes of the multiple resonance devices can be electrically connected to each other with power terminals and the extended wiring lines interposed therebetween. Accordingly, the multiple resonance devices can be collectively energized by bringing two probes into contact with a power terminal and a ground terminal, and work involving energization, such as frequency adjustment or electric connection inspection, can be carried out in a short time.

As for a method of manufacturing a resonance device according to an exemplary embodiment, an extended wiring line extends across a division line for division into multiple resonance devices. Consequently, the extended wiring lines of the adjacent resonance devices are connected to each other in the state of a collective board before dividing (e.g., chipping), and upper electrodes of the multiple resonance devices can be electrically connected to each other with power terminals and the extended wiring lines interposed therebetween. Accordingly, the multiple resonance devices can be collectively energized by bringing two probes into contact with a power terminal and a ground terminal, and work involving energization such as frequency adjustment or electric connection inspection can be simply carried out in a short time.

The exemplary embodiments are described above to make the present invention easy to understand and do not limit the present invention. It is noted that the present invention can be modified and altered without departing from the spirit thereof. The present invention includes equivalents. That is, embodiments obtained by appropriately modifying the embodiments and/or the modifications by a person skilled in the art are included in the scope of the present invention, provided that the embodiments have the features of the present invention. For example, the components according to the embodiments and/or the modifications, the arrangement thereof, the material, conditions, shape, and size are not limited to those described above by way of example and can be appropriately changed. It goes without saying that the embodiments and the modifications are described by way of example, and that the components according to the different embodiments and/or the modifications can be partially replaced or combined.

REFERENCE SIGNS LIST 1, 1', 1" resonance device
10 resonator
13 upper substrate
14 lower substrate
20 lower lid
21 depressed portion
22 bottom plate
23 side wall
30 upper lid
31 depressed portion
33 side wall
50 MEMS substrate
60 joint
65 connection member
100 collective board
110 hold arm
120 vibration member
125, 125A, 125B, 125C, 125D upper electrode
129 lower electrode
130 base
131a long side
131A front edge
131b long side
131B rear edge
131c, 131d short side
135, 135A, 135B, 135C, 135D vibration arm
140 hold member
235 protection film
236 frequency adjustment film
A region
B region
CL conductive layer
DD dummy pad
DE device
DT dummy terminal
DW dummy wiring line
F2 Si substrate
F3 piezoelectric thin film
G weight portion
GL3 ground wiring line
GT ground terminal
GW ground wiring line
L1 Si wafer
L3 Si wafer
L31 silicon oxide film
LL1, LL2 extended wiring line
LN1, LN2 division line
Lw, Lw1 line width
LW1, LW21, LW22 lower wiring line
P imaginary plane
PD1, PD2, PD3, PD4 power pad
SL1 power wiring line
ST1, ST2 power terminal
T1', T2' terminal
UW1, UW2 upper wiring line
V1, V2, V3 through-electrode

The invention claimed is:

1. A resonance device comprising:
a first substrate that includes a resonator having an upper electrode;
a second substrate having a first surface that faces the first substrate with the resonator disposed therebetween;
a first terminal disposed on a second surface of the second substrate that is opposite the first surface, with the first terminal being electrically connected to the upper electrode;
a second terminal disposed on the second surface of the second substrate and that is configured to apply a reference electric potential to the resonator; and
an extended wiring line that is electrically connected to the first terminal,
wherein the extended wiring line extends on the second surface of the second substrate from a first outer edge of the second surface of the second substrate to a second outer edge of the second surface of the second substrate.

2. The resonance device according to claim 1, wherein the resonator further includes a lower electrode that is electrically connected to the second terminal.

3. The resonance device according to claim 2, wherein the lower electrode extends to an outer edge of the resonator.

4. The resonance device according to claim 2, further comprising a joint that couples the first substrate to the second substrate and that is electrically connected to the second terminal.

5. The resonance device according to claim 4, wherein the joint includes a connection member that extends to an outer edge of the resonance device.

6. The resonance device according to claim 5, wherein the extended wiring line and the connection member are disposed such that a position of the extended wiring line at the first outer edge of the second surface of the second substrate differs from a position of the connection member at the first outer edge in a plan view thereof.

7. The resonance device according to claim 4, wherein the joint is disposed on the first substrate at a predetermined distance from an outer edge thereof.

8. The resonance device according to claim 1, wherein the first substrate comprises a degenerate silicon.

9. The resonance device according to claim 1, wherein a line width of the extended wiring line at the first outer edge is less than a line width at any position other than the first outer edge of the second surface of the second substrate.

10. The resonance device according to claim 1, wherein a line width of the extended wiring line at the first outer edge is less than a thickness of the second substrate.

11. The resonance device according to claim 1, wherein the first terminal includes a power pad and a power wiring line and the second terminal includes only a power pad, such that the first and second terminals have different surface areas.

12. A collective board for manufacturing a resonance device, the collective board comprising:
- a first substrate that includes multiple resonators that each include upper electrodes, respectively;
- a second substrate having a first surface that faces the first substrate with the multiple resonators disposed therebetween;
- multiple first terminals disposed on a second surface of the second substrate that is opposite the first surface, with the multiple first terminals being electrically connected to the respective upper electrodes of the multiple resonators;
- multiple second terminals disposed on the second surface and that are configured to apply a reference electric potential to the respective multiple resonators; and
- an extended wiring line that electrically connects one first terminal to another first terminal among the multiple first terminals, with the extended wiring line extending on the second surface across a division line for division of the first and second substrate into multiple resonance devices.

13. The collective board according to claim 12, wherein the multiple resonators each includes lower electrodes that are electrically connected to the multiple second terminals, respectively.

14. The collective board according to claim 13, wherein the multiple lower electrode each extend to an outer edge of the respective resonator.

15. The collective board according to claim 13, further comprising multiple joints that couple the first substrate to the second substrate and that are electrically connected to the multiple second terminals, respectively.

16. The collective board according to claim 15, wherein each of the multiple joints includes a connection member that respectively extends to an outer edge of the multiple resonance devices.

17. The collective board according to claim 16, wherein the extended wiring line and the respective connection members are disposed such that a position of the extended wiring line at the outer edge of the second substrate differs from a position of the respective connection member at the outer edge in a plan view thereof.

18. The collective board according to claim 12, wherein a line width of the extended wiring line at the outer edge is less than a line width at any position other than the outer edge of the second surface of the second substrate.

19. The collective board according to claim 12, wherein a line width of the extended wiring line at the outer edge is less than a thickness of the second substrate.

20. A method of manufacturing a resonance device, the method comprising:
- preparing multiple resonators that include respective upper electrodes as a first substrate, and a second substrate that has a first surface that faces the first substrate with the multiple resonators disposed therebetween and a second surface having disposed thereon multiple first terminals, multiple second terminals configured to apply a reference electric potential to the respective multiple resonators, and an extended wiring line that electrically connects respective first terminals among the multiple first terminals to each other;
- joining the first substrate to the second substrate, such that the multiple first terminals are electrically connected to the upper electrodes of the multiple resonators, respectively; and
- dividing the first substrate and the second substrate along a division line for division into multiple resonance devices,
- wherein the extended wiring line extends on the second surface of the second substrate across the division line.

* * * * *